United States Patent [19]

Fujisaki et al.

[11] Patent Number: 5,410,687
[45] Date of Patent: Apr. 25, 1995

[54] ANALYZING DEVICE FOR SAVING SEMICONDUCTOR MEMORY FAILURES

[75] Inventors: Kenichi Fujisaki; Noboru Okino, both of Gyoda, Japan

[73] Assignee: Advantest Corporation, Tokyo, Japan

[21] Appl. No.: 159,704

[22] Filed: Dec. 1, 1993

Related U.S. Application Data

[63] Continuation of Ser. No. 671,979, Mar. 19, 1991, abandoned.

[30] Foreign Application Priority Data

Mar. 19, 1990 [JP] Japan .................................. 2-69093

[51] Int. Cl.$^6$ ............................................. G06F 11/00
[52] U.S. Cl. .................................... 395/575; 371/10.3
[58] Field of Search ........................ 371/10.3; 365/200

[56] References Cited

U.S. PATENT DOCUMENTS

| | | | |
|---|---|---|---|
| 3,753,244 | 8/1973 | Sumilas | 365/200 X |
| 4,460,997 | 7/1984 | Harns | 371/10.3 |
| 4,460,999 | 7/1984 | Schmidt | 371/27 X |
| 4,586,178 | 4/1986 | Bosse | 371/10.3 |
| 4,635,190 | 1/1987 | Meyer | 365/200 |
| 4,736,373 | 4/1988 | Schmidt | 371/10 |
| 4,833,652 | 5/1989 | Isobe | 365/200 X |
| 4,837,747 | 6/1989 | Dosaka | 371/10.3 |
| 5,091,884 | 2/1992 | Kagami | 365/200 |

OTHER PUBLICATIONS

M. Tarr, et al, "Defect Analysis System Speeds Test and Repair of Redundant Memories", Electronics International, vol. 57, pp. 175–179, Jan. 1984, New York.

IBM Technical Disclosure Bulletin, vol. 31, No. 12, May 1989, pp. 107–108.
IBM Technical Disclosure Bulletin, vol. 32, No. 3A, Aug. 1989, pp. 427–428.

*Primary Examiner*—Robert W. Beausoliel, Jr.
*Assistant Examiner*—Glenn Snyder
*Attorney, Agent, or Firm*—Staas & Halsey

[57] ABSTRACT

A failure analysis of a semiconductor memory compares data written into and out of each cell of the semiconductor memory. When there is a disagreement, a "1" is written into a failure analysis memory. A disagreement signal is applied as a write command to column and row address fail count memories and is counted by a fail counter. The column address and row address fail count memories receive the column and row addresses, respectively. When the write command is applied to the column and row address fail count memories, the number of defective cells is read out of the memory addresses by a read modify write operation. A 1 is added by column and row adders to the number of defective cells read out, and the results are written into the column and row address fail count memories. The number of defective cells is read out of the column address fail count memory and compared with a number of row spare lines of the memory under test. When the former is greater than the latter, the column address is decided as a failing address line, is counted by a failing address line counter and is written into a failing address memory. The row address is sequentially changed, beginning with a 0, at each failing column address when a "1" is read out of the failure analysis memory. The contents of the memories are each rewritten by subtracting a 1 therefrom and the fail counter is decremented by one.

14 Claims, 13 Drawing Sheets

FIG. 3 PRIOR ART
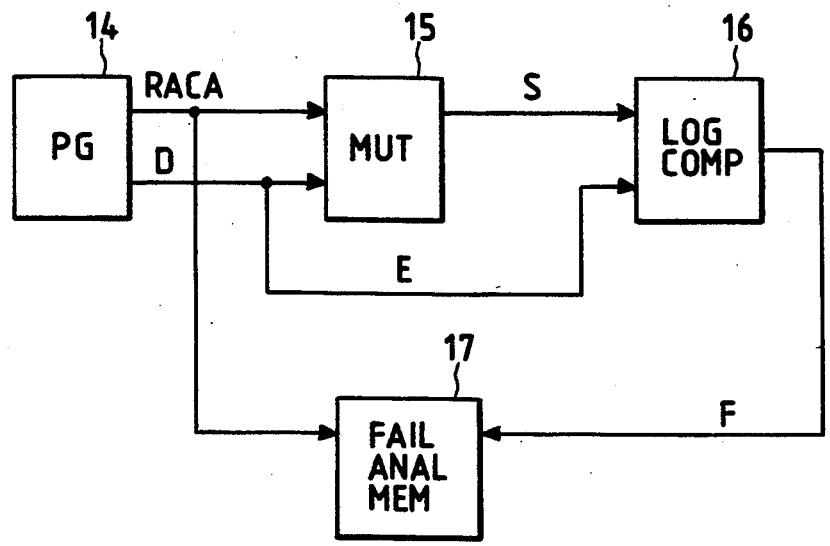
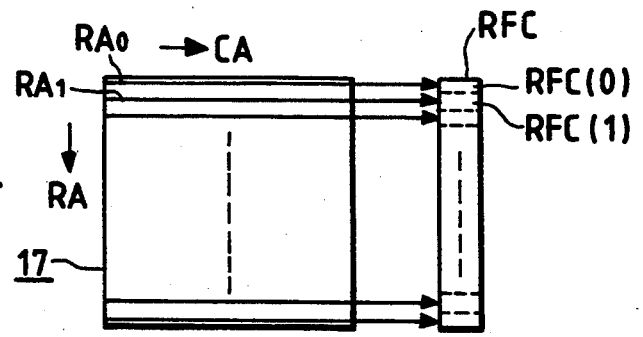
FIG. 4A PRIOR ART
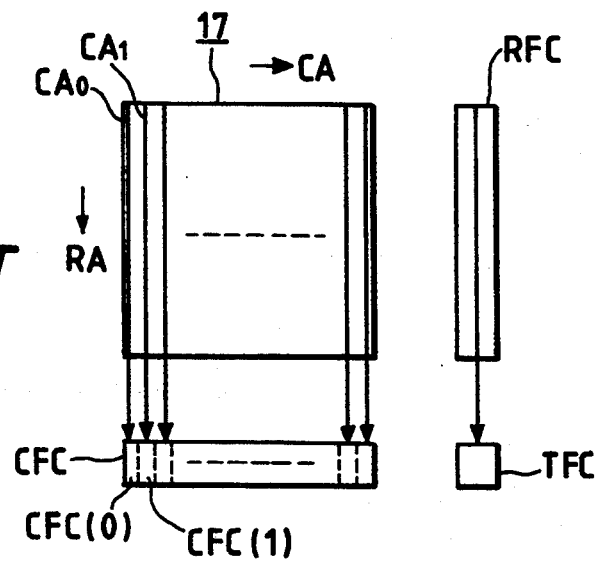
FIG. 4B PRIOR ART

ANALYZING DEVICE FOR SAVING SEMICONDUCTOR MEMORY FAILURES

This application is a continuation of application Ser. No. 07/671,979, filed Mar. 19, 1991, now abandoned.

BACKGROUND OF THE INVENTION

The present invention relates to an analyzing device for saving memory failures which is used with equipment for testing what is called a redundant-structured semiconductor memory having spare (or redundancy) lines which are used as substitutes for failing address lines.

As shown in FIG. 1, the redundant-structured memory has, on the outside of its memory area 11, column spare address lines 12 extending in parallel to its column address lines (and each having formed thereon memory cells of the corresponding column) and row spare lines 13 extending in parallel to row address lines (and each having formed thereon memory cells of the corresponding row), and when a fail is found in a function test of the memory, the failing row or column address line, i.e. the row or column address line including the failing cell, is electrically replaced with the spare line so that the memory can be used as a nondefective.

In the case where a failure is found in the memory area of the redundant-structured memory, the address of the failing cell is located, a check is made whether all failures are recoverable or not with spare lines, and if they are recoverable, it is analyzed which of the row and column spare lines should be substituted for the failing cells so as to use the memory as a nondefective. This analysis will hereinafter be referred to as an analysis for failure saving.

Data necessary for the failure saving analysis are the total number of failing cells (or fails) in the memory area (or an analysis block) 11 (which number will hereinafter be referred to as the total fail count TFC), the number of failing cells (or fails) on each row address line (which number will hereinafter be referred to as the row address fail count RFC) and the number of failing cells (or fails) on each column address line (which number will hereinafter be referred to as the column address fail count CFC). That is, the number of failing cells on the row address line $RA_i$ and the number of failing cells on the column address line $CA_j$ in the memory area 11 are counted as indicated by RFC(i) and CFC(j) in FIG. 2.

A description will be given first of a conventional method of such an analysis for failure saving. As shown in FIG. 3, during testing of a memory under test 15 an address RACA and data D available from a pattern generator 14 are provided to the memory 15 to write therein the data D at a memory cell specified by the address RACA, the stored content of the memory cell is read out, the read-out signal S is compared by a logic comparator 15 with an expected value E from the pattern generator 14, and when they do not match, a failure analysis memory 17 is accessed using the address RACA and a "1" is written thereinto.

After completion of a series of tests the failure analysis memory 17 is read out to obtain the data TFC, RFC and CFC necessary for the failure saving analysis. In this instance, as depicted in FIG. 4A, cells on row address lines $RA_0$, $RA_1$, ... of the failure analysis memory 17 are read out to count the numbers of "1s" on the respective row address lines and hence obtain count values RFC(0), RFC(1), ... Then, as shown in Fig. 4B, the numbers of "1s" on respective column address lines $CA_0$, $CA_1$, ... of the failure analysis memory 17 are similarly counted to obtain count values CFC(0), CFC(1), ... Thereafter, the row address fail counts RFC(0), RFC(1), ... or column address fail counts CFC(0), CFC(1), ... are added up to obtain the total fail count TFC.

Based on the total number of failing cells or the value of the total fail count TFC thus obtained, a check is made for the presence or absence of failing cells in the analysis block (i.e. the memory area) and for the possibility of saving the failing cells. That is to say, the maximum number of failing cells which can be saved by use of all the spare lines is compared with the total fail count TFC, making a check to see if the latter exceeds the former. Letting the numbers of row addresses RA and column addresses CA of the analysis block be represented by I and J, respectively, and the numbers of row spare address lines and column spare address lines by M and N, respectively, the maximum number of failing cells which can be saved is expressed by $J.M + I.N - M.N$.

Next, the detection of failing address lines and the assignment of spare lines (for saving them) are made, based on the data RFC and CFC, and then the row address fail counts RFC, the column address fail counts CFC and the total fail count TFC are updated accordingly. The number of failing cells RFC(i)=A (a variable) on the row address line $RA_i$ is compared with the number of usable column spare lines N=B (a variable), and when a line failure condition $A > B$ holds, the row address line $RA_i$ is detected as a failing address line. That is, when $A > B$, the number of column spare lines is insufficient to save all failing cells on the row address line $RA_i$. Therefore, it is necessary to use one of the row spare lines for saving the failing cells on the row address line $RA_i$. Thus, the row address line for which the line failure condition $A > B$ holds is regarded as a failing address line. Similarly, the number of failing cells CFC(j) on each column address line $CA_j$≡A is compared with the number of row spare lines M≡B, and when $A > B$, the column address line $CA_j$ is judged as a failing address line to be substituted with a column spare line.

When the failing address lines are thus detected and decided to be substituted with the spare lines or saved, the data RFC, CFC and TFC are each updated to a value having subtracted the number of failing cells on each saved failing address line from its initial fail count. At the same time, the numbers of spare lines M and N that can be used for saving are also updated accordingly and the line failure condition $A > B$ is checked again for each line. These operations are repeated.

After the removal of all failing address lines the remaining failing cells are saved by a method which starts the save with the address line having the largest number of failing cells, or a round robin algorithm. Then it is determined whether or not the memory under test can ultimately be used as a non-defective product, and if so, the address value of each address line containing the failing cells to be replaced with the spare line is obtained as a solution of the failure saving analysis.

As mentioned above, the prior art involves the counting of the number of failing cells for each row address line and for each column address line for obtaining the fail counts RFC and CFC, and hence calls for accessing twice the failure analysis memory 17 over the entire area of one analysis block—this consumes an appreciable amount of time. In addition, since each row (or column) address line is read out within a specified column (or row) address range and the number of "1s" in the range is counted, processes such as the readout of the address line, the specification of the address range to be read out next and starting of the operation are performed for each address line; so that much time is needed for obtaining the row address fail counts RFC and the column address fail counts CFC. Also in the case of simultaneously testing a plurality of memories, the processing for obtaining the counts RFC and CFC from the failure analysis memory 17 is performed for each memory under test, and consequently, much time is consumed for obtaining the values RFC, CFC and TFC for all of the memories under test.

Conventionally, the detection of a failing address line is made by comparing, for instance, the number of column spare lines M (=B) with the number of failing cells RFC(i) (=A) on each row address line RAi, and if the line failure condition (A>B) holds, then the element number i of the row address fail count RFC(i) is stored as a failing address in a memory and the count value of failing row address lines is incremented by one. Similar processing is performed for the number of failing cells CFC(j) (=A) on each column address line CAj and the failing address on the column address line is also stored in the memory. These processes by software are relatively time-consuming. Also in the case of simultaneously testing two or more memories, the above-mentioned detection of failing address lines and their storage into the memory are effected for each memory under test, so that the processing time is long as a whole.

Upon determination of the saving of failing address lines, defective cells thereon are removed and the data RFC, CFC and TFC are updated. In the prior art, for example, when an address 5 of the row address is decided to be saved as a failing address line, the row address fail count RFC (5) is subtracted from the total fail count TFC to update the latter and the former is reduced to zero. Next, the row address is fixed to the address 5, the column address is incremented sequentially from an address 0, the failure analysis memory 17 is accessed for each column address, and upon each readout of a "1" therefrom, the column address fail count CFC corresponding to that column address is decremented by one. This operation is repeated until the maximum value of the column address is reached, whereby the column address fail count CFC is updated. Thus, the illustrated prior art example takes much time for the updating of the column address fail count CFC. The same is true of the updating of the row address fail count RFC in the case of saving a column address line.

SUMMARY OF THE INVENTION

It is therefore an object of the present invention to provide an analyzer which permits a short-time or quick analysis for saving failing addresses of a semiconductor memory.

In accordance with a first aspect of the present invention, there is provided with a failure analysis memory in which when the result of comparison between write data and read data for each address of a memory under test disagrees, data "1" is written at the corresponding address in a read modify write mode. Data read out of the failure analysis memory in the read modify write mode is fed as an inhibit signal to an inhibit gate and the above-mentioned result of comparison is input into the inhibit gate. The column address being provided to the failure analysis memory is applied to a column address fail count (CFC) memory which is operated in the read modify write mode, and the read-out data from the CFC memory is incremented by one in a column address adder. When a disagreement output is provided from the inhibit gate, that is, when the read-out data from the failure analysis memory is a "0" and the result of comparison is a disagreement, the output from the column address adder is written into the CFC memory. In this way, the number of defective cells on each column address line of the memory under test is stored in the corresponding address of the CFC memory to provide the column address fail count CFC. Likewise, the row address being provided to the failure analysis memory is applied to a row address fail count (RFC) memory which is operated in the read modify write mode, and the read-out data from the RFC memory is incremented by one in a row address adder. When the inhibit gate provides a disagreement output, the output from the row address adder is written into the RFC memory. Consequently, the number of defective cells on each row address line of the memory under test is stored in the corresponding address of the RFC memory to provide the row address fail count RFC. The number of disagreement outputs from the inhibit gate is counted by a total fail counter to obtain the total fail count TFC.

According to a second aspect of the present invention, the failure analysis memory is read out over the entire area wherein "1s" have been written at addresses corresponding to defective cells of the memory under test, and the same address as the column address being read out in the failure analysis memory is provided to the CFC memory. The read-out data from the CFC memory is incremented by one in the column address adder, and upon each readout of data "1" from the failure analysis memory, the output of the column address adder is written into the CFC memory. In consequence, the number of data "1" on each column address line of the failure analysis memory is stored in the corresponding address of the CFC memory to obtain the column address fail count CFC. Similarly, the same address as the row address being read out in the failure analysis memory is provided to the RFC memory. The read-out data from the RFC memory is incremented by one in the row address adder, and upon each readout of data "1" from the failure memory, the output of the row address adder is written into the RFC memory. Thus, the number of data "1" on each row address line of the failure analysis memory is stored in the corresponding address of the RFC memory to obtain the row address fail count RFC. The number of data "1" read out of the failure analysis memory is counted by the total fail counter to obtain the total fail count TFC.

According to a third aspect of the present invention, the number of row address spare lines of the memory under test is stored in a register, the column address of the memory under test is used as a read address to sequentially read addresses of the CFC memory in which the number of defective cells on each column address line has been written, and the number of defective cells thus obtained is compared by a comparator with the number of spare lines stored in the register. Each time the comparator yields an output which indicates that the number of defective cells is greater than the number of spare lines, the address being provided to the CFC memory at that time is written as data in a failing address memory and the number of such writes is counted by a failing address counter. In this way, a failing column address line is detected and its address value is written into the failing address memory. Similarly, the number of column address spare lines of the memory under test is stored in the register, the row address of the memory under test is used as a read address to sequentially read addresses of the RFC memory in which the number of defective cells on each row address line has been written, and the number of defective cells thus obtained is compared by a comparator with the spare lines stored in the register. Each time the comparator yields an output indicating that the number of defective cells is greater than the number of spare lines, the address being provided to the RFC memory at that time is written as data in the failing address memory and the number of such writes is counted by the failing address counter.

According to a fourth aspect of the present invention, the CFC memory into which the number of defective cells on each column address line of the memory under test has been written and the RFC memory into which the number of defective cells on each row address line of the memory under test has been written are operated in the read modify write mode. Data read out of the CFC memory is decremented by one in a column address subtractor, whereas data read out of the RFC memory is decremented by one in a row address subtractor. The column (or row) address decided as a failing address line is provided as an address to the CFC (or RFC) memory, and addresses 0 through a maximum are provided one after another to the RFC (or CFC) memory. At the same time, the addresses being provided to the CFC memory and the RFC memory at that time are supplied as a column address and as a row address, respectively, to the failure analysis memory to read it out. When data "1" is read out of the failure analysis memory, the output of the column address subtractor is written into the CFC memory and the output of the row address subtractor is written into the RFC memory.

BRIEF DESCRIPTION OF THE DRAWINGS

FIG. 3 is a block diagram showing the general arrangement of a semiconductor memory tester;

FIG. 4A is a diagram showing a conventional method for obtaining the row address fail count RFC;

FIG. 4B is a diagram showing a conventional method for obtaining the column address fail count CFC;

DESCRIPTION OF THE PREFERRED EMBODIMENTS

Figure 1:
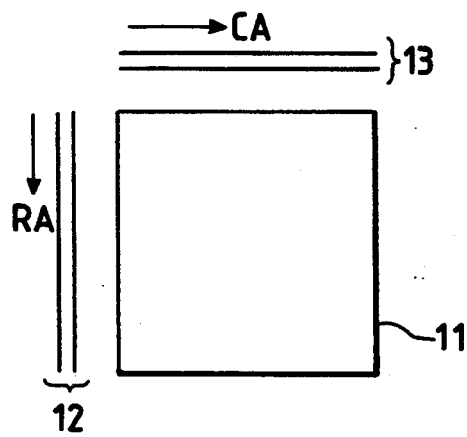
FIG. 1 is a diagram schematically showing a redundant-structured memory.
Figure 2:
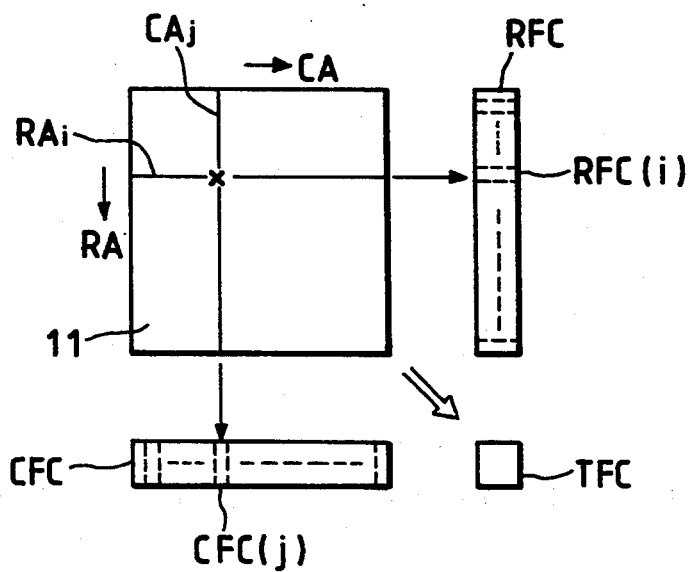
FIG. 2 is a diagram for explaining data for failure saving analysis.
Figure 5:
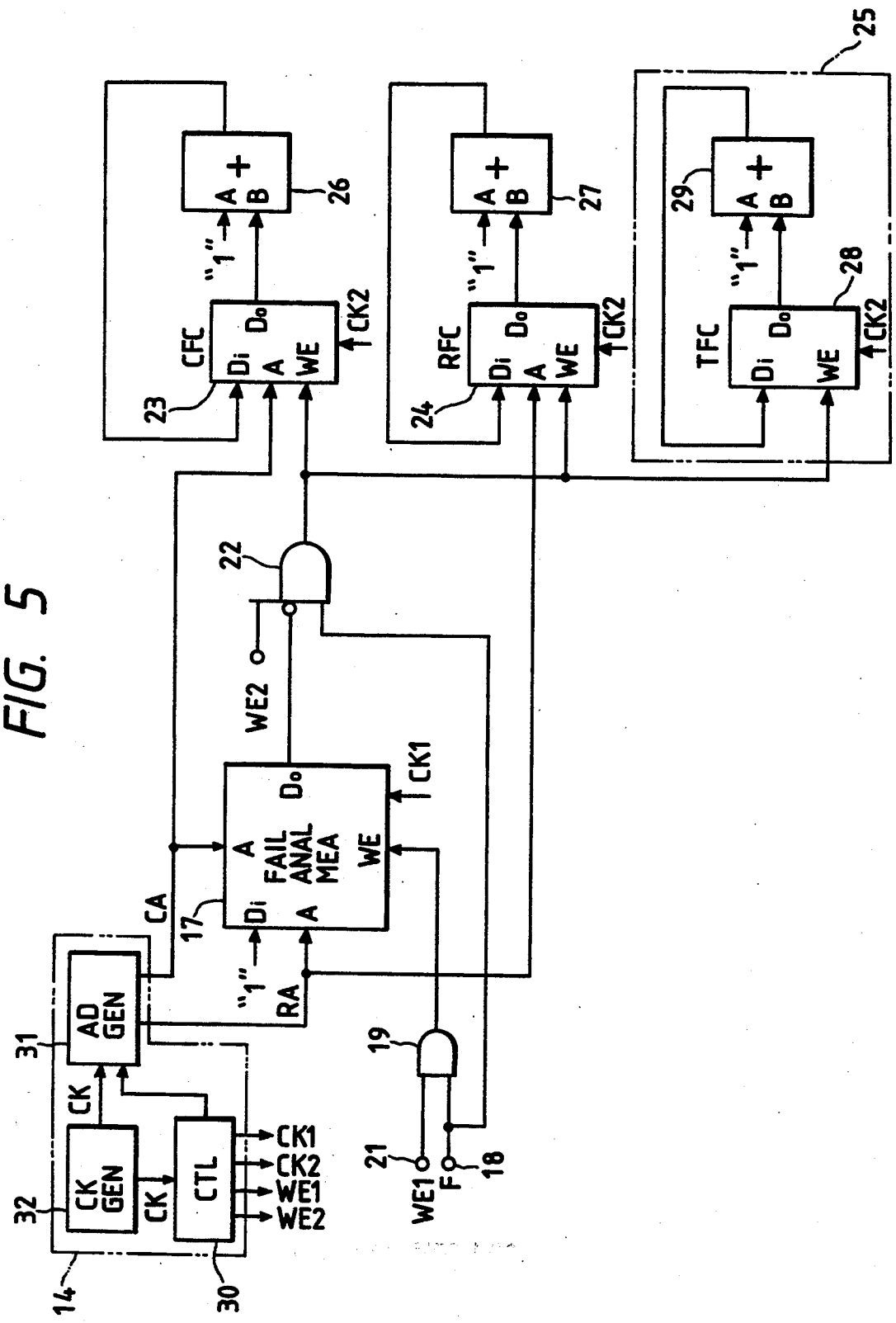
FIG. 5 is a block diagram illustrating the principal part of an embodiment according to the first aspect of the present invention.

FIG. 5 illustrates in block form the principal part of an embodiment for obtaining the column address fail counts CFC, the row address fail counts RFC and the total fail count TFC according to the first aspect of the present invention. This embodiment is formed as a unitary structure with the memory test equipment depicted in FIG. 3. An address generator 31 which responds to an operation clock CK to generate the column address CA and the row address RA, a clock generator 32 for generating the clock CK, and a control signal generator 30 which controls the address generation by the address generator 31 and generates clocks CK1 and CK2 and write commands WE1 and WE2 at predetermined timing in accordance with a program, constitute a part of the pattern generator 14 depicted in FIG. 3. The failure analysis memory 17 is used in the memory test equipment shown in FIG. 3. In response to the clock CK1 the failure analysis memory 17 is operated in the read modify write mode and, in each test cycle, its readout is followed by a write therein every time the write command WE1 is provided to write enable terminal WE of the memory 17. The failure analysis memory 17 is supplied, for each test cycle, with the column address CA and the row address RA from the address generator 31 of the pattern generator 14, and the output F from the logical comparator 16, which represents the result of comparison between the output S of the memory under test and the expected value E in FIG. 3, is applied via a terminal 18 to an AND circuit 19. The AND circuit 19 is also supplied with the write command WE1 via a terminal 21 at predetermined timing for each test cycle. The output of the AND circuit 19 is applied to the write enable terminal WE of the failure analysis memory 17, which is supplied with logic "1" at its data terminal Di.

In this embodiment, data Do read out of the failure analysis memory 17 is provided as an inhibit signal to an inhibit gate 22. The inhibit gate 22 is also supplied with the write command WE2 which is generated at proper timing for each test cycle and the output F via the terminal 18. This embodiment further includes a column address fail count memory (hereinafter referred to as the CFC memory) 23, a row address fail count memory (hereinafter referred to as the RFC memory) 24 and a total fail counter 25. The CFC and RFC memories 23 and 24 are simultaneously operated in the read modify write mode in response to the clock CK2. The column address CA provided to the failure analysis memory 17 is applied as an address to the CFC memory 23, and the row address provided to the failure analysis memory 17 is applied as an address to the RFC memory 24. Data read out of the CFC memory 23 is incremented by one in a column adder 26, the output of which is applied to a data terminal Di of the CFC memory 24. Data read out of the RFC memory 24 is incremented by one in a row adder 27, the output of which is applied to a data terminal Di of the RFC memory 24. The output of the inhibit gate 22 is provided to the write enable terminal WE of each of the CFC and RFC memories 23 and 24. The total fail counter 25 is to count the number of "1s" in the output of the inhibit gate 22; in this example, it is composed of a memory 28 (hereinafter referred to as the TFC memory) and an adder 29. Data read out of the TFC memory 28 is incremented by one in the adder 29, the output of which is applied to a data terminal Di of the TFC memory 28. The output of the inhibit gate 22 is provided also to the write enable terminal WE of the TFC memory 28. The TFC memory 28 is responsive to the clock CK2 to be operated in the read modify write mode, together with the CFC and RFC memories 23 and 24, and is adapted so that a predetermined fixed address is always accessed for the same analysis block 11. Since the same memory cell is usually accessed a plurality of times by a sequence of quasi-random addresses which are produced during the test of one semiconductor memory, the inhibit gate 22 is provided for preventing the same defective cell from being counted a plurality of times as a fail.

With such an arrangement, when the above-mentioned result of comparison is a disagreement, the signal F from the terminal 18 goes to a "1" and the write command WE1 in this test cycle is applied from the terminal 21 via the AND circuit 19 to the failure analysis memory 17, in which data "1" is written at an address specified by the column and row addresses at that time. Prior to this write the failure analysis memory 17 is read out in the same test cycle, and if the read-out data is not a "1" but a "0", then the inhibit gate 22 is not disabled but is supplied with a disagreement output "1", and hence permits the passage therethrough of the write command WE2 for input into the CFC memory 23, the RFC memory 24 and the TFC memory 28. In consequence, the output of the column adder 26 is written into the CFC memory 23 at the same address as the column address being accessed in the failure analysis memory 17 at that time, and at the same time, the output of the row adder 26 is written into the RFC memory 24 at the same address as the row address being accessed in the failure analysis memory 17 at that time. The write command WE2 from the inhibit gate 22 also causes the content of TFC memory 28 by one.

The memories 23, 24 and 28 are cleared before starting the test. Accordingly, when a first write is effected in a certain address of the CFC memory 23, the data read out therefrom immediately prior to the write is a "0" and the column adder 26 increments it to a "1", which is written into the CFC memory 23. When the next write is effected again in the same address, the data read out therefrom immediately prior to the write is a "1" and the column adder 26 increments it by one to a "2", which is written into the CFC memory 23. Since each address of the CFC memory 23 is the same as each column address of the failure analysis memory 17, the number of data "1" on each column address line of the failure analysis memory 17 is counted at each address of the CFC memory 23.

The RFC memory 24 also similarly operates and the number of data "1" on each row address line of the failure analysis memory 17 are counted at each address of the RFC memory 24. In the TFC memory 28 the number of "1s" in the failure analysis memory 17 is counted. In the actual test of the memory under test the same cell is read out a plurality of times in one test as mentioned previously. However, if a disagreement is detected first for the same cell, data "1" is written into the cell of the failure analysis memory 17 corresponding to that cell of the memory under test, and consequently, even if a disagreement is detected again for the same cell, the prestored data "1" is read out of the failure analysis memory 17 at this time and the inhibit gate 22 is disabled; so that no write will be effected in the memories 23, 24 and 28 by the second and subsequent disagreement detected outputs.

Figure 6:
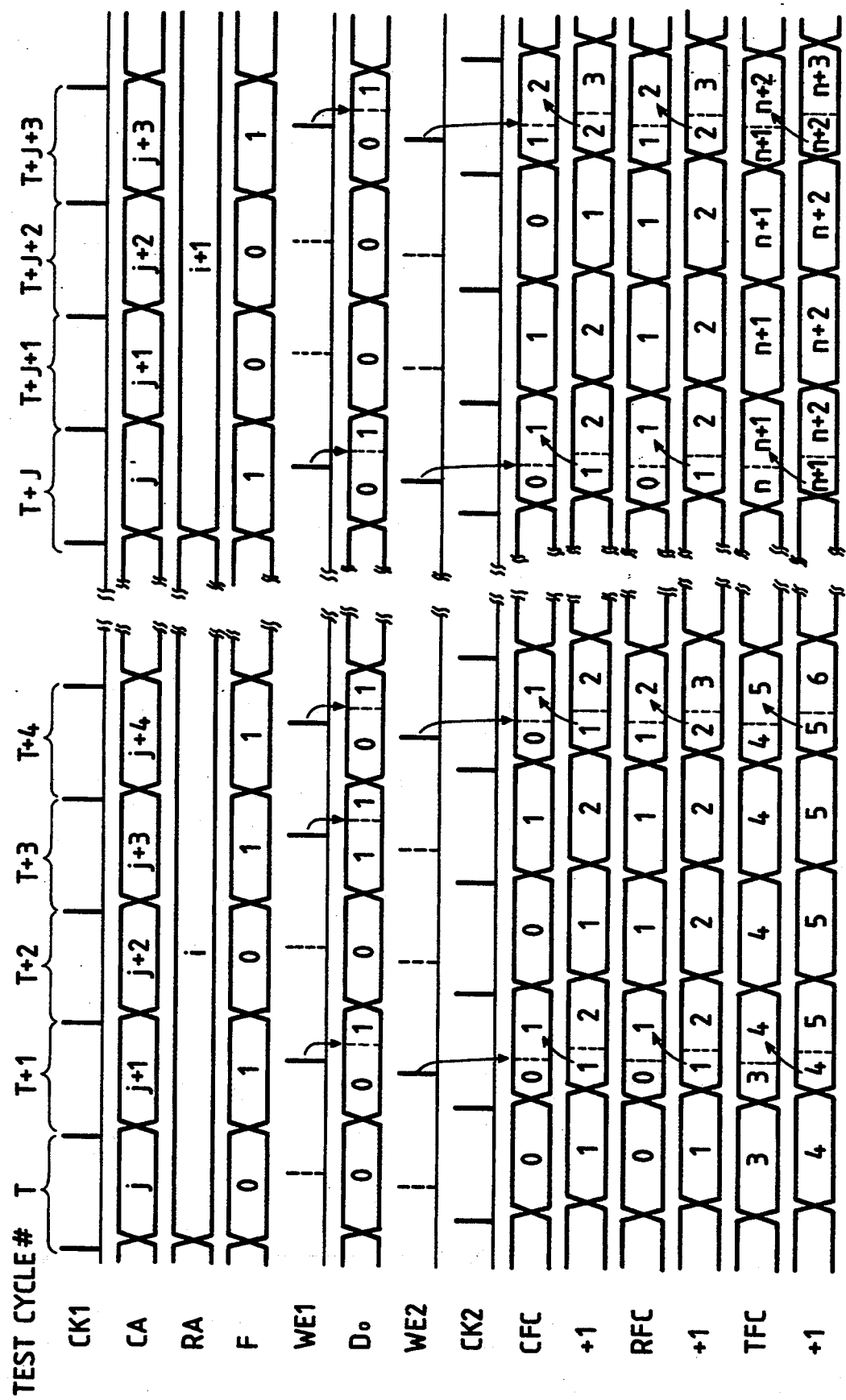
FIG. 6 is a timing chart for explaining the operation of the embodiment depicted in FIG. 5.

FIG. 6 shows a timing chart during the counting of defective cells by the embodiment depicted in FIG. 5 along with a sequence of test cycles for testing the memory 15 by the test equipment depicted in FIG. 3. In the actual memory test the addresses CA RA are not always generated in ascending or descending order; rather, it is customary to generate the addresses on a quasi-random basis. In this example, however, the states of various signals and data in each test cycle are shown on the assumption, for a better understanding of the invention, that as the test cycle proceeds to T, T+1, T+2, ..., the column address CA is sequentially incremented to j, j+1, j+2, ... with respect to the row address RA=i and that as the test cycle proceeds to T+J, T+J+1, T+J+2, ..., the column address CA is again incremented sequentially to j, j+1, j+2, ... with respect to the row address RA=i+1. The pulses shown by broken lines in the rows of write commands WE1 and WE2 indicate that they are inhibited by the gates 19 and 22, respectively. Reference character Do denotes data Do read out of the failure analysis memory 17, and "+1" in the rows right under the three rows CFC, RFC and TFC show the added outputs of the adders 26, 27 and 29, respectively.

In this example, during the test cycle T (CA=j, RA=i) the signal F indicating the afore-mentioned result of comparison is a "0" (a coincidence output, which represents that the memory cell tested is normal) and the data Do read out of the failure analysis memory 17 is a "0"; in this case, since the write commands WE1 and WE2 are both inhibited by the gates 19 and 22, no writes will be effected in the memories 17, 23, 24 and 28. Incidentally, the total fail count TFC detected by the sequence of test cycles until the test cycle T is reached is shown to be three. In the test cycle T+1 the signal F is a "1" (a disagreement output representing that the memory cell tested is defective) and the data Do read out of the failure analysis memory 17 is a "0". In response to the write command WE1 the "1" of the signal F is written into the memory 17 at the address (CA=j+1, RA=i) being specified at that time, and in response to the write command WE2 the contents CFC and RFC of the corresponding addresses CA=j+1, RA=i in the memories 23 and 24 are incremented by one and the content of a fixed address in the TFC memory 28 is also incremented by one. In the test cycle T+3 the signal F is a "1" and the data Do read out of that address CA=j+3, RA=i in the failure analysis memory 17 which is being specified at that time is a "1" (representing that it has already been recorded that the memory cell is defective); in this instance, the write command WE2 is inhibited by the gate 22 and no writes will be effected in the memories 23, 24 and 28. The operation states in the test cycles T+2, T+J+1, T+J+2 are similar to those in the test cycle T, whereas the operation states in the test cycles T+4, T+J, T+J+3 are similar to those in the test cycle T+1.

For example, in the test cycle T the signal F is a "0", and consequently, the content CFC of the CFC memory 23 at the address CA=j remains intact at the "0" whereas in the test cycle T+J for the same address RA=j the signal F is a "1", and consequently, the same stored content CFC=0 is read out and is then incremented by one in the adder 26, thereafter being written into the same address CA=j of the CFC memory 23. In the test cycle T+1, since the signal F is a "1", the content at the address CA=J+1 in the CFC memory 23 is incremented to CFC=1. In the test cycle T+J+1 for the same address CA=J+1, since the signal F is a "0", the above-said content CFC=1 remains unchanged. In the test cycle T+3, since the signal F is a "1" but the output Do is a "1" the content CFC=1 at the address CA=j+3 remains unchanged. In the test cycle T+J+3 for the same address CA=J+3, since the signal F is a "1" the content at this address is incremented to CFC=2. The content RFC at the address RA=i in the RFC memory 24 is incremented to RFC=1 in the test cycle T+1 and is further incremented to RFC=2 in the test cycle T+4. The content RFC at the address RA=i+1 in the RFC memory 24 is incremented to RFC=1 in the test cycle T+J and is further incremented to RFC=2 in the test cycle T+J+3. The content TFC at the fixed address in the TFC memory 28 is incremented by one in each of the test cycles T+1, T+4, T+J and T+J+3.

After the comparison testing between the output S read out of the memory under test and the expected value E is made for all memory cells in the analysis block, the number of defective cells CFC on each column address line is obtained in corresponding one of addresses of the CFC memory 23, the number of defective cells RFC on each row address line is obtained in corresponding one of addresses of the RFC memory 24 and the total number of defective cells TFC in the analysis block is obtained in the fixed address of the TFC counter 25, respectively.

Unlike the prior art the embodiment shown in FIG. 5 counts the number of defective cells while at the same time making the test, and hence obviates the necessity of obtaining the fail counts CFC, RFC and TFC by reading out the failure analysis memory 17 after the test. Since the failure analysis memory 17 is operated in the read modify write mode in all of the test cycles, however, its high-speed operation may sometimes be difficult, and hence is not suitable for the test of a high-speed memory, besides, since data is read out during the test, the speed-up of its operation cannot be implemented through use of the interleave method.

Figure 7:
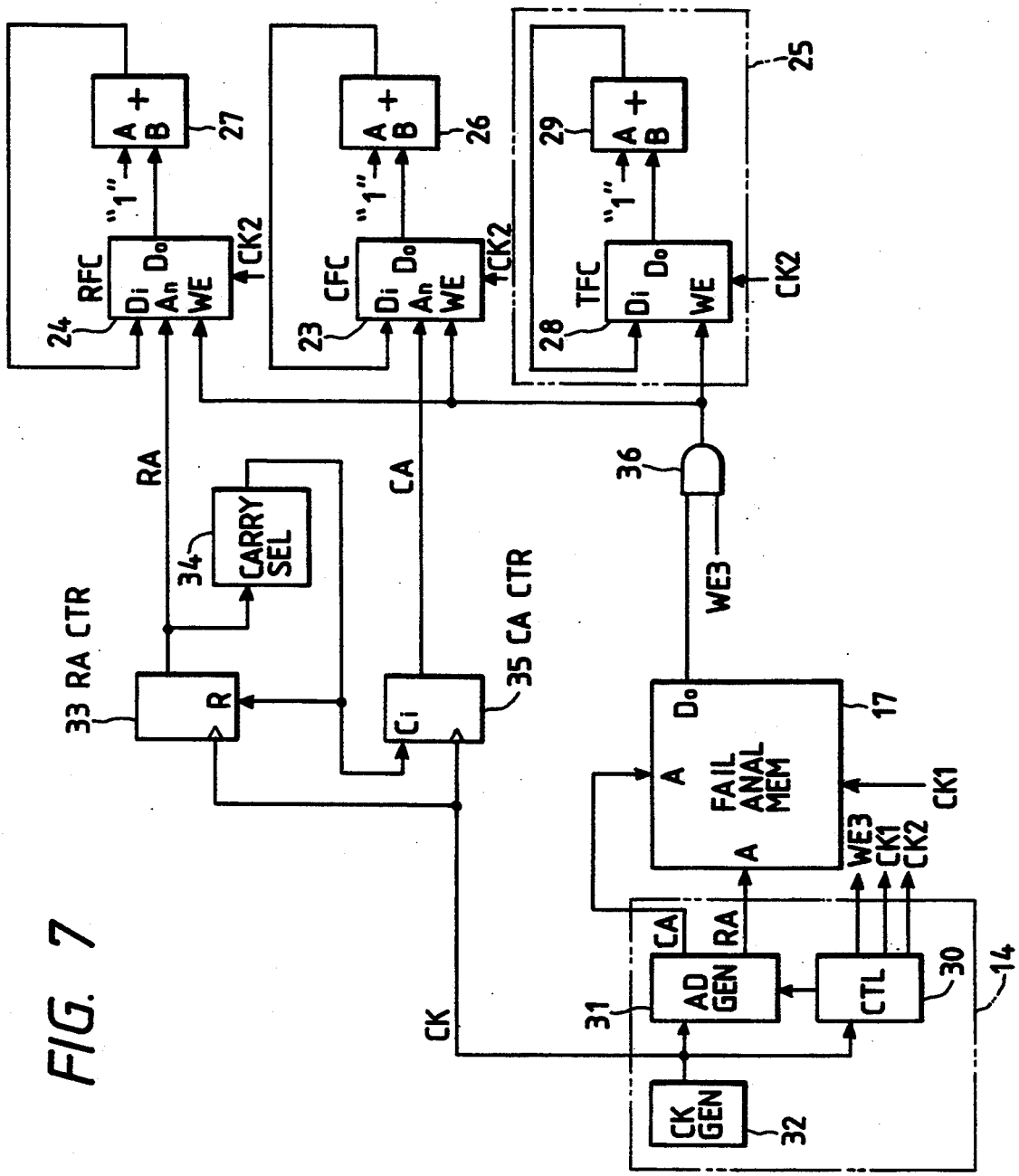
FIG. 7 is a block diagram illustrating an embodiment according to the second aspect of the present invention.

FIG. 7 illustrates in block form an embodiment according to the second aspect of the present invention which is adapted, in view of the above, so that upon completion of the test, the failure analysis memory is read out to obtain the fail counts CFC, RFC and TFC through utilization of a hardware structure. As is the case with the FIG. 5 embodiment, this example includes the CFC memory 23, RFC memory 24, the TFC counter 25, the column adder 26 and the row adder 27. The control signal generating section 30, the address generator 31 and the clock generator 32 are provided in the pattern generator 14 of the memory test equipment depicted in FIG. 3, and the failure analysis memory 17 is also provided in the memory test equipment.

The entire area of one analysis block in the failure analysis memory 17 after completion of the test is read out for each cell, using the row and column addresses RA and CA generated in increasing order by the address generator 31. At this time, the same addresses as the row and column addresses RA and CA which are provided to the failure analysis memory 17 are provided as addresses to the CFC and RFC memories 23 and 24, respectively. To this end, in this embodiment clock pulses CK which are applied from the clock generator 32 to the address generator 31 are counted by a row address counter 33, its count value is provided as the address RA to the RFC memory 24 and is also provided to a carry selector 34, by which a preset maximum value of the row address is detected. The detected output is counted by a column address counter 35 in synchronism with the clock CK from the clock generator 32 and the count value is provided as the address CA to the CFC memory 23. In the case where the maximum value is detected by the carry selector 34, the row address counter 33 is reset to zero at the same time as the column address counter 35 is incremented by one. By simultaneously starting the address generator 31 and the row address counter 33, the count value of the row address counter 33 is made to coincide with the row address which is applied to the failure analysis memory 17, and by setting the carry selector 34, the count value of the column address counter 35 is made to coincide with the column address which is provided to the failure analysis memory 17.

The read output Do of the failure analysis memory 17 is supplied to a gate 36, which is also supplied with a write command WE3 from the control signal generating section 30 for each read cycle of the failure analysis memory 17. The output of the gate 36 is applied to the write enable terminal WE of each of the memories 23, 24 and 28. As is the case with the FIG. 5 embodiment, the memories 23, 24 and 28 are simultaneously operated in the read modify write mode and the data read out of them are incremented by one in the adders 26, 27 and 29, respectively. When data "1" is read out of the failure analysis memory 17, the write command WE3 at that time is applied via the gate 36 to the memories 23, 24 and 28 to effect writes therein. It will easily be understood, therefore, that when the entire area of the analysis block in the failure analysis memory 17 has been read out, the fail counts CFC, RFC and TFC for the analysis block are obtained in the memories 23, 24 and 28, respectively.

Incidentally, the column address CA and the row address RA, which are being generated by the address generator 31 during the readout of the failure analysis memory 17, may also be branched and provides as addresses to the CFC and RFC memories 23 and 24, respectively. In such a case, it is necessary to connect the outputs of the address generator 31 to the memories 23 and 24 via bit lines of the same number as the number of bits of address data CARA. Further, lines for receiving therethrough the clock CK2 and the read output Do (i.e. write command WE3) are also necessary. With such an arrangement as shown in FIG. 7 wherein the address generating means formed by the row address counter 33, the carry selector 34 and the column address counter 35 is provided exclusively for the memories 23 and 24, the connection to the existing test equipment requires only lines for receiving the clocks CK, CK2 and the read out Do of the failure analysis memory 17.

Figure 8:
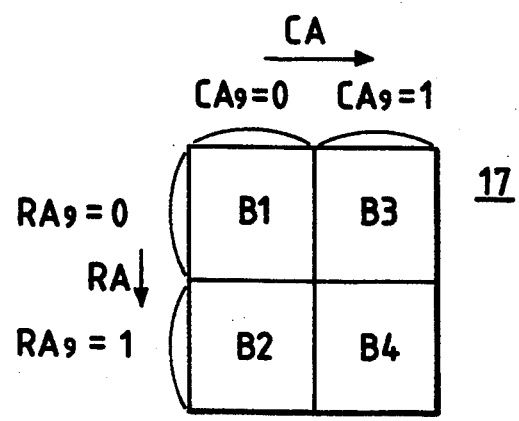
FIG. 8 is a diagram schematically showing a memory having a plurality of analysis blocks.
Figure 9:
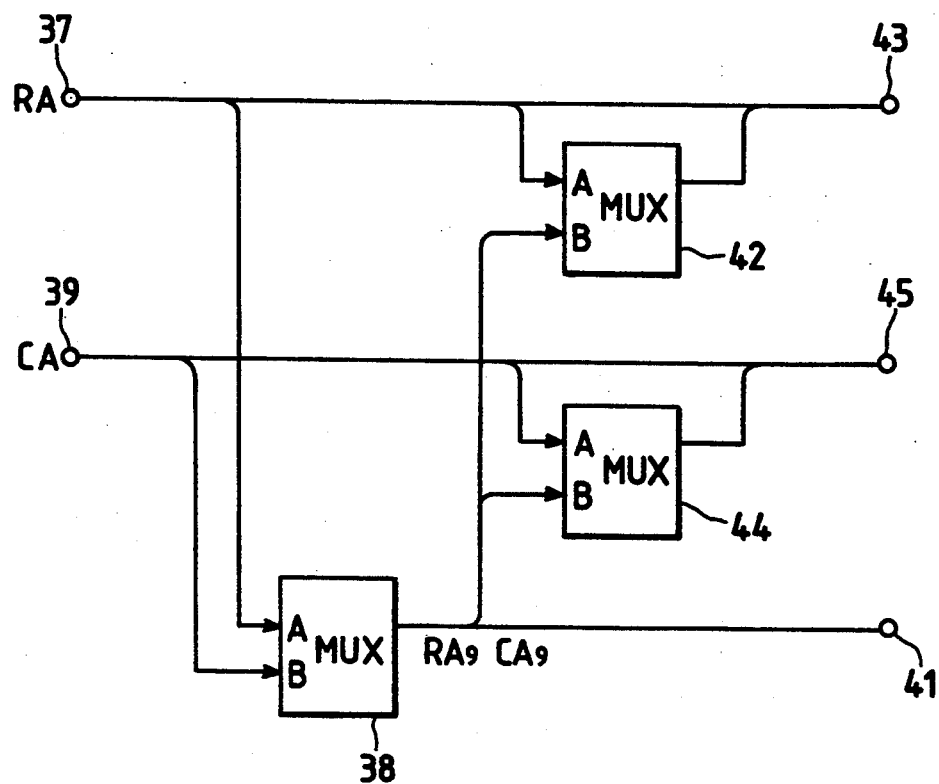
FIG. 9 is a block diagram showing an example of an arrangement for generating addresses which are provided to fail count memories in the case where the fail counts CFC, RFC and TFC for each analysis block of the memory with the plurality of analysis blocks are obtained in the embodiment of FIG. 7.
Figure 10A:
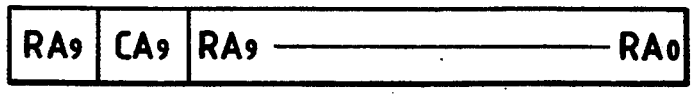
FIG. 10A is a diagram showing an example of addresses for the RFC memory which are obtained with the FIG. 9 arrangement for the memory shown in FIG. 8.
Figure 10B:
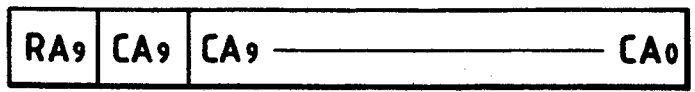
FIG. 10B is a diagram similarly showing an example of addresses for CFC memory.
Figure 10C:
FIG. 10C is a diagram similarly showing an example of addresses for the TFC memory.
Figure 11A:
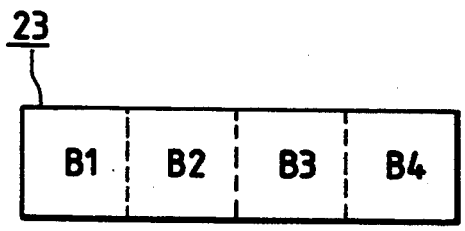
FIG. 11A is a diagram showing an example of the CFC memory for the memory depicted in FIG. 8.
Figure 11B:
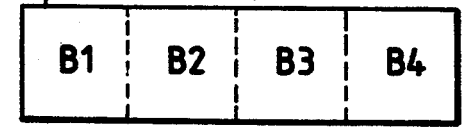
FIG. 11B is a diagram similarly showing an example of the RFC memory.
Figure 11C:
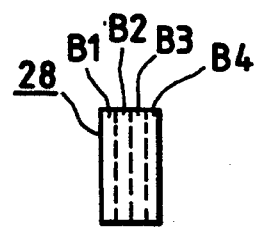
FIG. 11C is a diagram similarly showing an example of the RFC memory.

In the case where there are stored in the failure analysis memory 17 the results of testing of two or more analysis blocks, it is also possible to count the fail counts CFC, RFC and TFC for each analysis block while at the same time continuously reading out the entire area of the failure analysis memory 17. This will be described in respect of the case where, for example, as shown in FIG. 8, the failure analysis memory 17 is divided into four analysis blocks B1 through B4, the row address RA and the column address CA of the memory 17 are both 10-bit width and the analysis blocks B1, B2, B3 and B4 are selected when the most significant bits $RA_9$ and $CA_9$ of the both addresses are "0" and "0", "1" and "0", "0" and "1", and "1" and "1", respectively. In this instance, as depicted in FIG. 9, the same address as the row address RA which is provided to the failure analysis memory 17 for its readout is input into a multiplexer 38 via a terminal 37 and the same address as the column address CA which is provided to the failure analysis memory 17 is input into the multiplexer 38 via a terminal 39. In the multiplexer 38 the bits for determining the analysis block to be selected, i.e. $RA_9$ and $CA_9$ in this example, are extracted from the above-said addresses, and these bits $RA_9$ and $CA_9$ are provided as an address (FIG. 10C) via a terminal 41 to the TFC memory 28 shown in FIG. 7. Further, the output of the multiplexer 38 is also supplied to a multiplexer 42, in which it is appended to the high order of the row address RA provided from the terminal 37, and this multiplexer output is provided, as an address shown in FIG. 10A, via a terminal 43 to the RFC memory 24 depicted in FIG. 7. Likewise, the output of the multiplexer 38 is also applied to a multiplexer 44, wherein it is appended to the high order of the column address CA provided from the terminal 39, and this multiplexer output is provided, as an address shown in FIG. 10B, via a terminal 45 to the CFC memory 23 in FIG. 7. Thus, when the continuous readout of the entire area of the failure analysis memory 17 is completed, the column address fail counts CFC, the row address fail counts RFC and the total fail counts in the analysis blocks B1, B2, B3 and B4 of the failure analysis memory 17 are obtained in areas B1, B2, B3 and B4 of the CFC memory 23 as shown in FIG. 11A, in areas B1, B2, B3 and B4 of the RFC memory 24 as shown in FIG. 11B and in areas B1, B2, B3 and B4 of the TFC memory 28 as shown in FIG. 11C, respectively. By changing the bits which are selected in the multiplexer 38 and by selecting the low order bits to which the selected bits are appended in the multiplexers 42 and 44, the divided analysis blocks can be changed in size, and if the bits are not appended in the multiplexers 42 and 44, then the row address RA and the column address CA for an undivided analysis block are obtainable at the terminals 43 and 45.

While in FIG. 8 the area of each analysis block is specified by the most significant bits of the row and column addresses RA and CA, there are cases where other bits of the addresses are used for specifying the area of the analysis block. The idea described above in connection with FIG. 9 is applicable as well to the case of obtaining the fail counts CFC, RFC and TFC while at the same time making the test depicted in FIG. 5. The number of analysis blocks for storing the results of test in the failure analysis memory 17 is not limited specifically to four.

Figure 12:
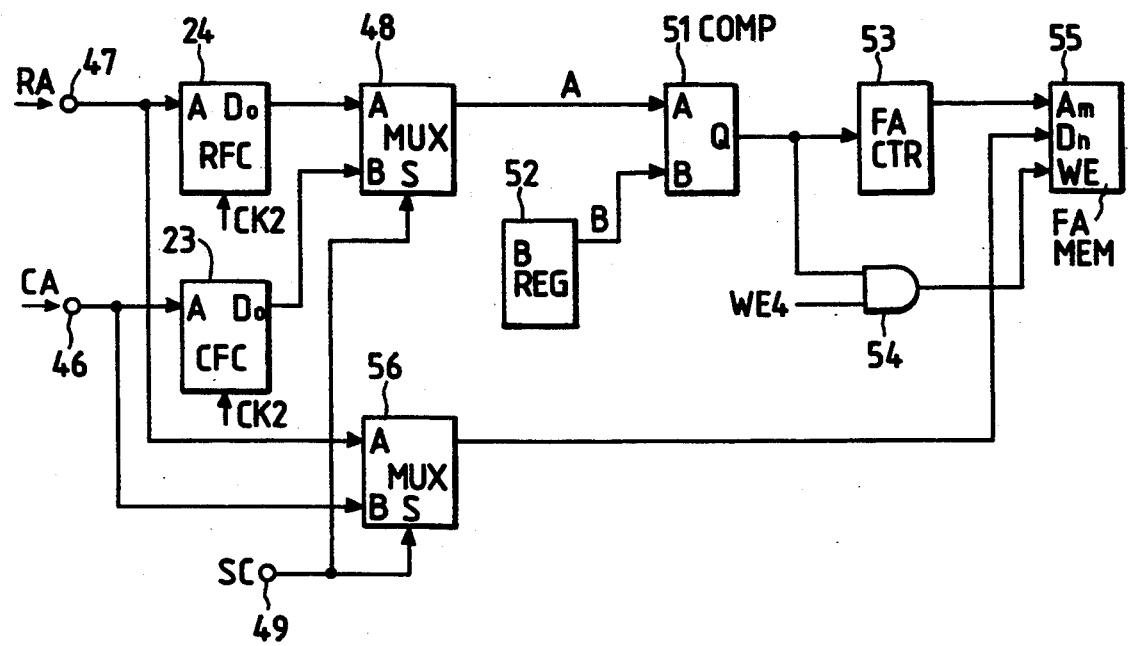
FIG. 12 is a block diagram illustrating an embodiment according to the third aspect of the present invention.

FIG. 12 illustrates in block form an embodiment according to the third aspect of the present invention, in which failing address lines are detected from the fail counts CFC and RFC obtained in the CFC and RFC memories 23 and 24 in the FIG. 5 or 7 embodiment and their addresses, i.e. failing addresses are recorded. That is, the illustrated arrangement is to detect failing addresses. The CFC memory 23 has written in each address $CA_j$ thereof the number of defective cells, CFC(j), on the column address line $CA_j$ of the memory under test (one analysis block). The RFC memory 24 has similarly written in each address $RA_i$ thereof the number of defective cells, RFC(i), on the row address line $RA_i$ of the same memory under test (one analysis block).

The column and row addresses CA and RA are available from the address generator 31 in the pattern generator 14 (see FIG. 5 or 7) or from the counters 33 and 35 in FIG. 7. The column address CA is provided via a terminal 46 to the CFC memory 23 to read it out, and the row address RA is provided via a terminal 47 to the RFC memory 24 to read it out. The data thus read out of the CFC memory 23 and the data thus read out of the RFC memory 24 are provided to a multiplexer 48, wherein either one of these data is selected in accordance with a select control signal SC from a terminal 49. The output A of the multiplexer 48 is applied as one of two inputs of a comparator 51, wherein it is compared with the number of usable spare lines, B, stored in a register 52. When the output of the CFC memory 23 is selected in the multiplexer 48, the number of row spare lines is prestored in the register 52, whereas when the output of the RFC memory 24 is selected, the number of column spare lines is prestored in the register 52. When it is determined in the comparator 51 that the read-out output, i.e. the number of defective cells, A, is larger than the number of spare lines, B, that is, when the line failure condition A>B holds, the output of the comparator 51 goes to a "1", which is counted by a failing address line counter 53. The output of the comparator 51 is also applied to a gate 54, which is also supplied with a write command WE4 at proper timing for each read cycle of the memory 23 or 24. The output of the gate 54 is applied to a write enable terminal WE of a failing address memory 55. The count value of the counter 53 is provided as an address to the failing address memory 55. The column address CA at the terminal 46 and the row address RA at the terminal 47 are also provided to a multiplexer 56, which is controlled by the select control signal SC from the terminal 49, and when the output of the CFC memory 23 is selected by the multiplexer 48, the column address CA is selected by the multiplexer 56.

In this arrangement the failing address line counter 53 and the memory 55 are cleared in advance. For example, in the case of selecting the output of the CFC memory 23, column addresses CA are provided, one by one, to the terminal 46 in increasing order starting with the address 0. Consequently, the numbers of defective cells on respective column address lines are sequentially read out of the CFC memory 23, starting at the address 0. The numbers of defective cells thus read out are each supplied via the multiplexer 48 to the comparator 51, wherein the number of defective cells, A, on each column address line is compared with the number of row spare lines, B, stored in the register 52. When the line failure condition $A > B$ does not hold, the output of the comparator 51 is a "0", the counter 53 is not incremented and no write is effected in the memory 55. When the line failure condition $A > B$ holds, the output of the comparator 51 goes to a "1", which is counted by the counter 53, and the gate 54 is enabled, through which the write command WE4 is supplied to the memory 55, and the column address CA at the terminal 46 at that time is written as failing address data into the failing address memory 55 via the multiplexer 56 using the count value of the counter 53 as an address. Thus, by generating the column addresses up to the maximum address, those of the column addresses in the respective column address lines for which the line failure condition holds are all obtained in the failing address memory 55 and the number of failing address lines is obtained in the failing address line counter 53.

Where the count value of the counter 53 is larger than the number of column spare lines, the defective column address lines are regarded as impossible of saving and then processing is discontinued. When the count value of the counter 53 is smaller than the number of column spare lines, the failing column address lines are saved by assigning the column spare lines to them. By subtracting the number of defective cells on each address line thus saved from each of the values of the fail counts RFC and CFC corresponding to the address line and by subtracting the number of all the defective cells to be saved from the value of fail count TFC, using the procedure described later in respect of FIGS. 17A through 17D, the fail counts RFC, CFC and TFC are updated. Further, the number of usable column spare lines is updated by subtracting the column spare lines thus used for saving the failing column address lines from the pre-stored number of all column spare lines. Next, the counter 53 and the memory 55 are cleared, preparations are made for selecting the output of the RFC memory 24 by the multiplexer 48, the number of usable row spare lines is stored in the register 52, row addresses are provided, one by one, to the terminal 47 in increasing order starting at the address 0, and operations similar to those mentioned above are performed with the updated counts CFC, RFC, TFC and the updated number of column spare lines, by which failing row addresses are obtained in the memory 55 and their number is obtained by the counter 53.

The multiplexers 48 and 56 may also be omitted, in which case, for example, the output of the RFC memory 24 is applied directly to the comparator 51, the row address RA at the terminal 47 is supplied directly to the data terminal of the memory 55, and a comparator, a failing address line counter and a failing address memory are also provided exclusively for the CFC memory 23 so that failing row and column addresses and their numbers are obtained at the same time.

Figure 13:
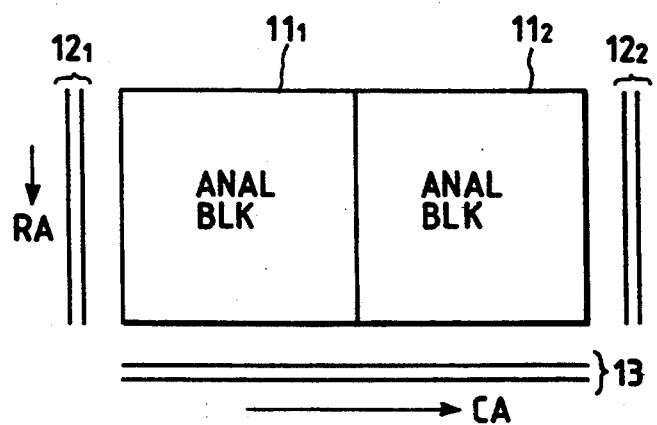
FIG. 13 is a diagram schematically showing an example of a memory in which analysis blocks 11a and 11b have common spare lines.
Figure 14:
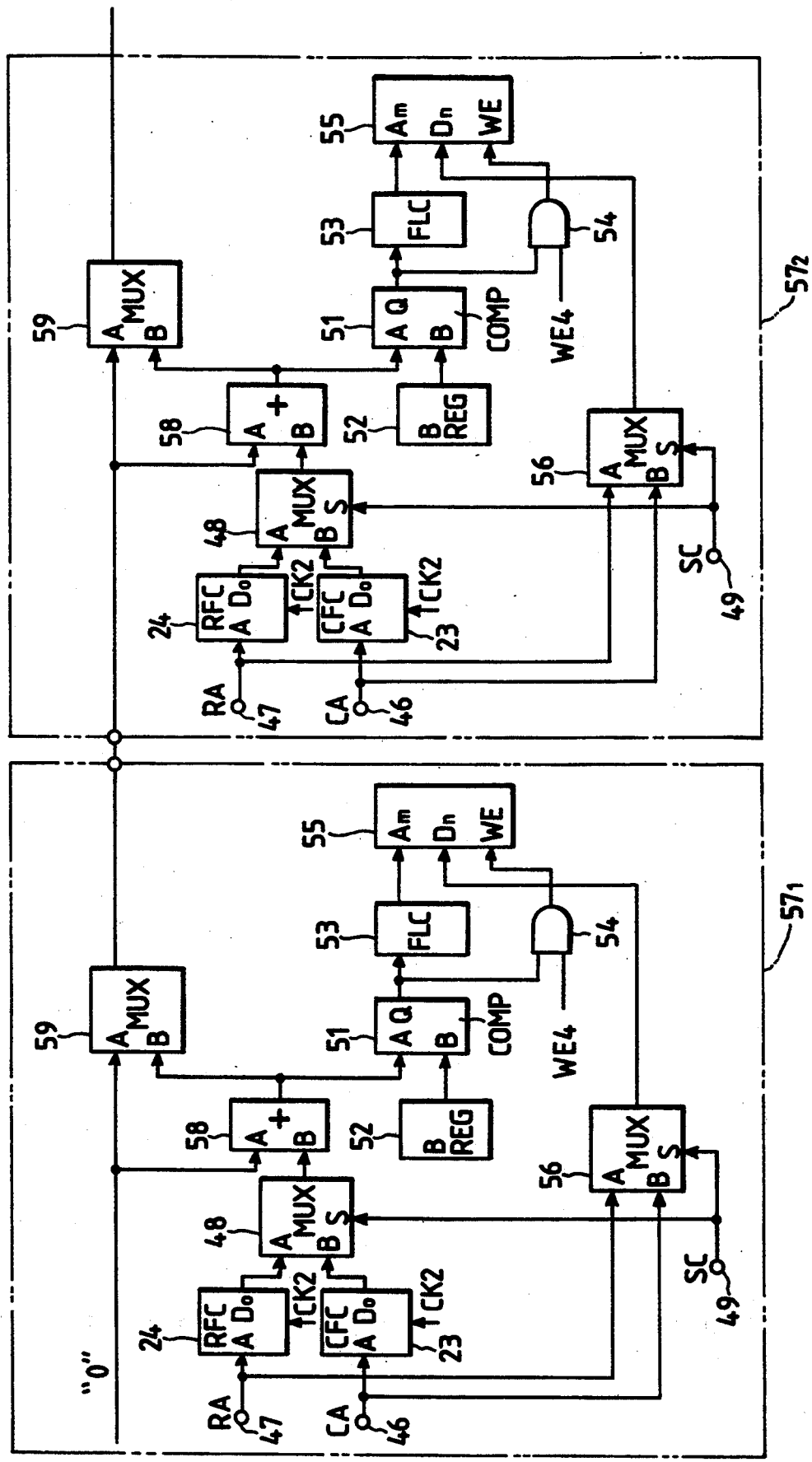
FIG. 14 is a block diagram illustrating an example in which failing address lines of the memory depicted in FIG. 13 are detected by the arrangement of FIG. 12.

For example, there is a case as shown in FIG. 13, where the semiconductor memory under test is composed of two analysis blocks $11_1$ and $11_2$ and the column spare lines are assigned individually to the analysis blocks $11_1$ and $11_2$ as indicated by $12_1$ and $12_2$, but the row spare lines may sometimes be assigned in common to both analysis blocks $11_1$ and $11_2$ as indicated by 13. Supposing that the fail counts CFC and RFC are obtained in the CFC and RFC memories 23 and 24 provided individually for the analysis blocks $11_1$ and $11_2$, failing addresses can be detected at high speed by use of such an arrangement as follows: That is, a pair of failing address detecting sections $57_1$ which are substantially identical in construction with the embodiment depicted in FIG. 12 are provided in tandem as shown in FIG. 14. In FIG. 14 the parts corresponding to those in FIG. 12 are identified by the same reference numerals and characters. In the failing address detecting section $57_1$ the CFC and RFC memories 23 and 24 respectively hold the data CFC and RFC for the analysis block $11_1$. An adder 58 is connected between the multiplexer 48 and the comparator 51. The adder 58 adds the output number of defective cells from the multiplexer 48 and the number of defective cells "0" from a failing address detecting section of the preceding stage (not provided in this example) and supplies the added output to the comparator 51 and a multiplexer 59. The multiplexer 59 selects either one of the number of defective cells "0" from the failing address detecting section of the preceding stage (not provided in this example) and the output of the multiplexer 48 (the number of defective cells) and provides the selected number of defective cells to the succeeding failing address detecting section $57_2$. The failing address detecting section $57_1$ is identical in construction with the embodiment of FIG. 12 except the above. The failing address detecting section $57_2$ has the same construction as that of the failing address detecting section $57_1$, and the CFC and RFC memories 23 and 24 respectively hold the data CFC and RFC for the analysis block $11_2$.

In the case where the row spare lines 13 are provided in common to the analysis blocks $11_1$ and $11_2$ as depicted in FIG. 13, failing row address lines are detected first and then they are saved using the row spare lines. In the case of detecting the row failing addresses, the preceding failing address detecting section $57_1$ needs only to supply the number of defective cells RFC on each row address line in the analysis block $11_1$ to the succeeding failing address detecting section $57_2$, and in the failing address detecting section $57_1$ the operations of the elements 51 to 56 are ignored. Accordingly, in the failing address detecting section $57_1$ it is necessary only to set the multiplexer 59 to select the output of the adder 58 and to set the multiplexer 48 to select the output of the RFC memory 24. On the other hand, in the failing address detecting section $57_2$ the multiplexer 48 is set to select the output of the RFC memory 24, the multiplexer 56 is set to select the row address RA supplied from the terminal 47, and the number of column spare lines for one analysis block (on the assumption that the numbers of spare lines $12_1$ and $12_2$ for the blocks $11_1$ and $12_2$ are the same) is stored in the register 52.

Row addresses (RA) from 0 to the maximum number are provided, one by one, to the terminals 47 of the failing address detecting sections 57₁ and 57₂ in common to them. In the failing address detecting section 57₁ the number of defective cells read out of the RFC memory 24 by each row address RA is added by the adder 58 to the number of defective cells "0" from the preceding stage. The added output is supplied via the multiplexer 59 to the succeeding failing address detecting section 57₂, wherein it is added by the adder 58 to the number of defective cells read out of the RFC memory 24 by the same row address RA, by which is obtained the number of defective addresses on the row address line common to the analysis blocks 11₁ and 11₂. The number of failing addresses thus obtained is compared by the comparator 51 with the number of column spare lines set in the register 52. When the former is greater than the latter, the line failure condition holds, with the result that the counter 53 is incremented, and the row address at that time is written as a data into the failing address memory 55 using the count value of the counter 53 as an address. In this way, failing addresses of the row address lines common to the analysis blocks 11₁ and 11₂ can be detected and these failing addresses are obtained in the failing address memory 55 in the failing address detecting section 57₂.

In the case of obtaining failing addresses on the column side, the first step is to save defective cells by allotting the row spare lines to the failing row address lines detected as mentioned above, and then the data CFC and RFC stored in the memories 23 and 24 of the failing address detecting sections 57₁ and 57₂ are updated accordingly. At the same time, the number of usable row spare lines is also updated. Next, the multiplexers 59 in the failing address detecting sections 57₁ and 57₂ are each set to select the number of defective cells supplied from the preceding stage, making the input A to each adder 58 (the input from the preceding stage) a "0". Each multiplexer 48 is set to select the output of the CFC memory 23, each multiplexer 56 is set to select the column address CA which is supplied from the terminal 46, and the updated number of row spare lines is stored in each register 52. Let it be assumed that the most significant bits of the column addresses of the analysis blocks 11₁ and 11₂ are bits which identify the respective blocks and that the lower order bits are common to the both blocks 11₁ and 11₂. Column addresses (CA) from 0 to the maximum number, except the most significant bits, are provided in succession to the terminals 47 of the failing address detecting sections 57₁ and 57₂ in common to them. It will easily be understood that failing addresses in the analysis blocks 11₁ and 12₂ are simultaneously obtained, by parallel processing, in the failing address memories 55 of the failing address detecting sections 57₁ and 57₂.

Figure 15:
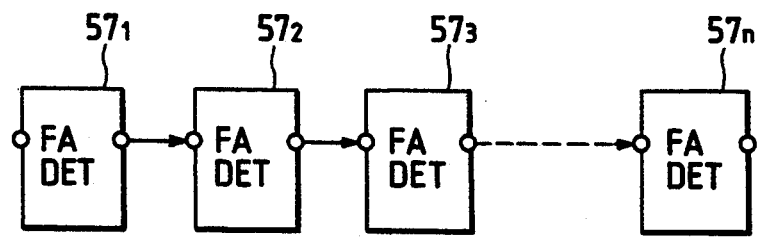
FIG. 15 is a block diagram of a general arrangement in which failing address detecting sections shown in FIG. 14 are connected in cascade for detecting failing address lines, by parallel processing, from CFC and RFC data obtained for each plurality of blocks.

Thus, failing addresses on the row side can be obtained from the fail counts CFC and RFC for the analysis blocks 11₁ and 11₂, by generating once the row addresses from 0 to the maximum address, while failing addresses on the column side can be obtained through parallel processing; therefore, the processing time can be reduced accordingly. By a cascade connection of more failing address detecting sections 57₁ to 57ₙ as shown in FIG. 15, it is possible to obtain failing addresses for more analysis blocks in one failure analysis memory. As will be seen from FIG. 14, each failing address detecting section can be put in what is called a "through" state, by setting the multiplexer 59 to select the input A. Accordingly, the numbers of row or column defective cells held in a desired number of failing address detecting sections can sequentially be added by setting the multiplexers of the desired number of failing address detecting sections to select the input B and by setting the multiplexers 59 of the other failing address detecting sections to select the input A.

In the example of FIG. 14, for example, when the fail counts CFC and RFC are each four-bits, a four-bit full adder is used as each adder 58, in which case its carry output and each output (a bit output) are ORed with each other to produce ORed 4-bit output as the output of the adder 58 Thus, when the carry output is a "1" the output F (=1111) is always provided. By this, the result of addition of the fail counts RFC or CFC represents a correct value from 0 to 14, and when the result of addition exceeds 14, it always represents "1111" (=15) and a true value is unknown. In many cases, however, since only several row and column spare lines are prepared for each analysis block, no error will be induced in the result of comparison, even if the comparator 51 is of the four-bit configuration, not a five-bit one. Accordingly, the multiplexer 59 need not be of the five-bit configuration either but may be of the four-bit one. This affords reduction of the amount of hardware used.

Next, a description will be given, with reference to FIG. 16, of an embodiment according to the fourth aspect of the present invention in which the updating of the data CFC, RFC and TFC in accordance with the saving of failing address lines, that is, the processing for removing defective cells on the saved failing address lines, is performed by hardware. The data CFC, RFC and TFC, obtained in the CFC and RFC memories 23 and 24 and in the TFC counter 25, respectively, as referred to previously in respect of FIG. 5 or 7 embodiment, are corrected, based on the saving of the failing address lines according to the FIG. 12 embodiment. Also in this embodiment the column and row addresses CA and RA are available from the address generator 31 in the pattern generator 14 of the memory test equipment depicted in FIG. 3 as is the case with the FIG. 5 embodiment, and the failure analysis memory 17 also form a part of the test equipment shown in FIG. 3.

The total fail count TFC has been stored in the TFC memory 28 of the fail counter 25, and the CFC, RFC and TFC memories 23, 24 and 25 are operated in the read modify write mode in response to the common clock CK2. the number of defective cells, which is read out of the CFC memory 23 by the column address CA provided in each clock cycle, is supplied to a subtractor 61, wherein it is subtracted by one, and the result of subtraction is provided to the data terminal Di of the CFC memory 23 and is written thereinto at the same column address in response to the write command WE3 in the same clock cycle. The number of defective cells, which is read out of the RFC memory 24 by the row address RA provided in each clock cycle, is supplied to a subtractor 62, wherein it is subtracted by one, and the result of subtraction is provided to the data terminal Di of the RFC memory 24 and is written thereinto at the same row address in response to the write command WE3 in the same clock cycle. The number of defective cells, which is read out of the TFC memory 28 by a predetermined address in each cycle, is subtracted by one in a subtractor 63, and the result of subtraction is provided to the data terminal Di of the memory 28 and is written thereinto at the same address in response to the write command WE3 in the same clock cycle. The column address CA, which is provided via a terminal 64 to the failure analysis memory 17, is supplied as an address to the RFC memory 24. The data read out of the failure analysis memory 17 is provided to the gate 36 and a gate 67, which are also supplied with the write command WE3 at proper timing in each read cycle of the failure analysis memory 17. The output of the gate 36 is applied to the write enable terminals WE of the CFC and RFC memories 23 and 24. Either one of the data Do read out of the CFC and RFC memories 23 and 24 is selected by the multiplexer 48, and the selected data is supplied to a zero detector 69. The zero detector 69 outputs a "0" only when bits of the input data are all "0s" and outputs a "1" in other cases. The output of the zero detector 69 is applied to the gate 67, whose output is applied to the write enable terminal WE of the TFC memory 28.

For instance, the multiplexer 48 is set to select the output of the CFC memory 23, the row address RA of one of failing address lines decided to be saved by the device shown in FIG. 12 is provided to a terminal 65, and in this state column addresses (RA) from 0 to the maximum address are provided one after another to the terminal 64, by which cells on the row address line in the failure analysis memory 17 corresponding to the saved row address line are sequentially read out from the memory 17. At this time, the CFC and RFC memories 23 and 24 are also simultaneously read out by the column and row addresses CA and RA. When the data thus read out of the failure analysis memory 17 is a "0", the gates 36 and 37 are disabled to inhibit the write command WE3 and no writes are effected in the CFC, RFC and TFC memories 23, 24 and 28. When data "1" is read out of the failure analysis memory 17, the data read out of the CFC memory 23 is subtracted by one in the column subtractor 61 and the result of subtraction is written into the CFC memory 23; the data read out of the RFC memory 24 is subtracted by one in the row subtractor 62 and the result of subtraction is written into the RFC memory 24; and the data read out of the TFC memory 28 is subtracted in the subtractor 63 and the result of subtraction is written into the TFC memory 28. By reading out the fail count memories 23, 24 and 28 while varying the column address from 0 to the maximum address in this way, the data in the row address of the RFC memory 24 is reduced to zero through its subtraction by the number of defective cells on the saved row address line, and the data in the TFC memory 28 is also subtracted by the same number as that of the above-mentioned defective cells. Further, the data in each of the column addresses of the CFC memory 23 wherein the defective cells on the saved row address line exist is subtracted by one. Similar processing is performed for each of the other saved row address lines.

Following the updating of the data CFC, RFC and TFC in the memories 23, 24 and 28, the number of usable row spare lines, that is, the value obtained by subtracting the number allotted to the failing row address lines for saving them from the number of all the row spare lines, is set in the register 52 in FIG. 12 and then the failing column address lines to be saved are detected by the device shown in FIG. 12. Next, the processing for the removal of the defective cells based on the saving of the failing column address lines, that is, the updating of the data CFC, RFC and TFC, is performed by the device of FIG. 16 as described below.

The multiplexer 48 is set to select the data read out of the RFC memory 24, the column address CA of one of the saved column address lines is provided to the terminal 64 and the row addresses (RA) from 0 to the maximum address are provided, one by one, to the terminal 65, by which the failure analysis memory 17 is read out. As a result of this, the data in the column address of the CFC memory 23 is reduced to zero through its subtraction by the number of defective cells on the saved column address line, and the data in the TFC memory 28 is also subtracted by the same number as that of the above-said defective cells. Moreover, the data in each of the row addresses of the RFC memory 24 wherein the defective cells on the saved column address line exist is subtracted by one. Similar processing is performed for each of the other saved column address lines.

Figure 17A:
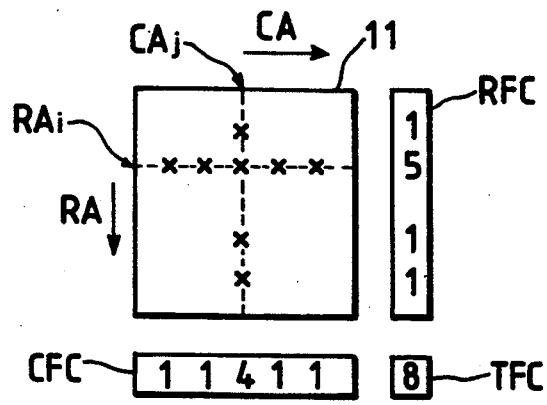
FIGS. 17a–17D show concrete examples of updating the RFC, CFC and TFC data based on the saving of failing addresses.
Figure 17B:
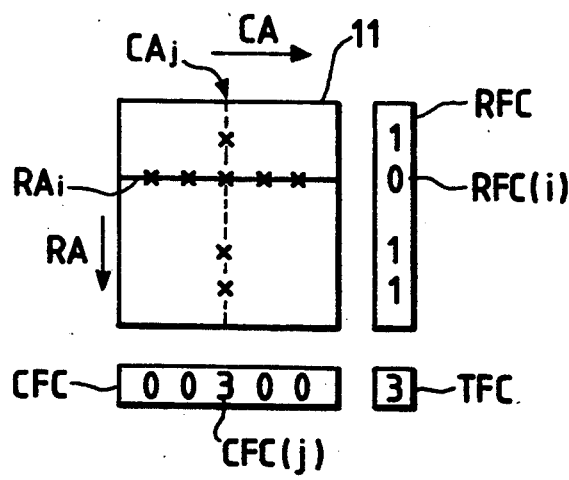

The gate 67, the multiplexer 48 and the zero detector 69 are provided for preventing that the count for the same defective cell at the intersection of the saved row and column address lines is subtracted twice from the TFC memory 28. Now, consider the case where four and five defective cells (fails) exist on the column and row address lines CAj and RAi in the analysis block 11 of the memory as indicated by crosses in FIG. 17A, the data CFC, RFC and TFC for this analysis block 11 are obtained as depicted in FIG. 17A and the address line of the row address RAi on which the five defective cells exist is decided to be saved first. In this instance, the row address RAi is specified first and column addresses are generated, one by one, from address 0 to the maximum one to update the data CFC, RFC and TFC based on the saving of the row address line, as described previously. As a result of this, the data RFC(i) on the row address RAi is reduced to zero as shown in FIG. 17B and the data CFC of the column addresses where the defective cells on the saved row address line exist are each subtracted by one as shown in FIG. 17B. The TFC data is subtracted by the number of defective cells on the row address line RAi, and hence is 3.

Next, let it be assumed that the column address line CAj on which three defective cells are left unsaved in FIG. 17B is decided to be saved. The data CFC, RFC and TFC are updated, based on the saving of this column address line. In the case of employing an arrangement in which the gate 67, the multiplexer 48 and the zero detector 69 are not provided in the embodiment of FIG. 16 and the output of the gate 36 is also supplied to the write enable terminal of the TFC memory 28, the number "4" of defective cells on the column address line CAj is subtracted from the data "3" in the address CAj of the CFC memory 23, and at the same time, the number "4" of defective cells is also subtracted from the data "3" in the TFC memory 28, as shown in FIG. 17C. Incidentally, the subtractors 61 and 62 are each so constructed as to output a "0" when the result of subtraction is minus. The data RFC and CFR are each updated as depicted in FIG. 17C, and in this case, the defective cell at the intersection of the saved column and row address lines is subtracted twice from the TFC data. In other words, the fail count TFC cannot correctly represent the total number of defective cells remaining unsaved. With the provision of the gate 67, the multiplexer 48 and the zero detector 69 as depicted in FIG. 16, however, when the row address becomes RAi as shown in FIG. 17B in the process of sequentially changing the row address from 0 to the maximum number on the column address line CAj, the data RFC(i) in the address RAi of the RFC memory 24 has already been reduced to zero by the data updating based on the address line saving on the row side and this is detected by the zero detector 69. The gate 69 is disabled by the detector output "0", and consequently, no write is effected in the TFC memory 28, even if data read out of the failure analysis memory 17 at that time is a "1". Thus, correct data updating takes place as depicted in FIG. 17D.

Figure 16:
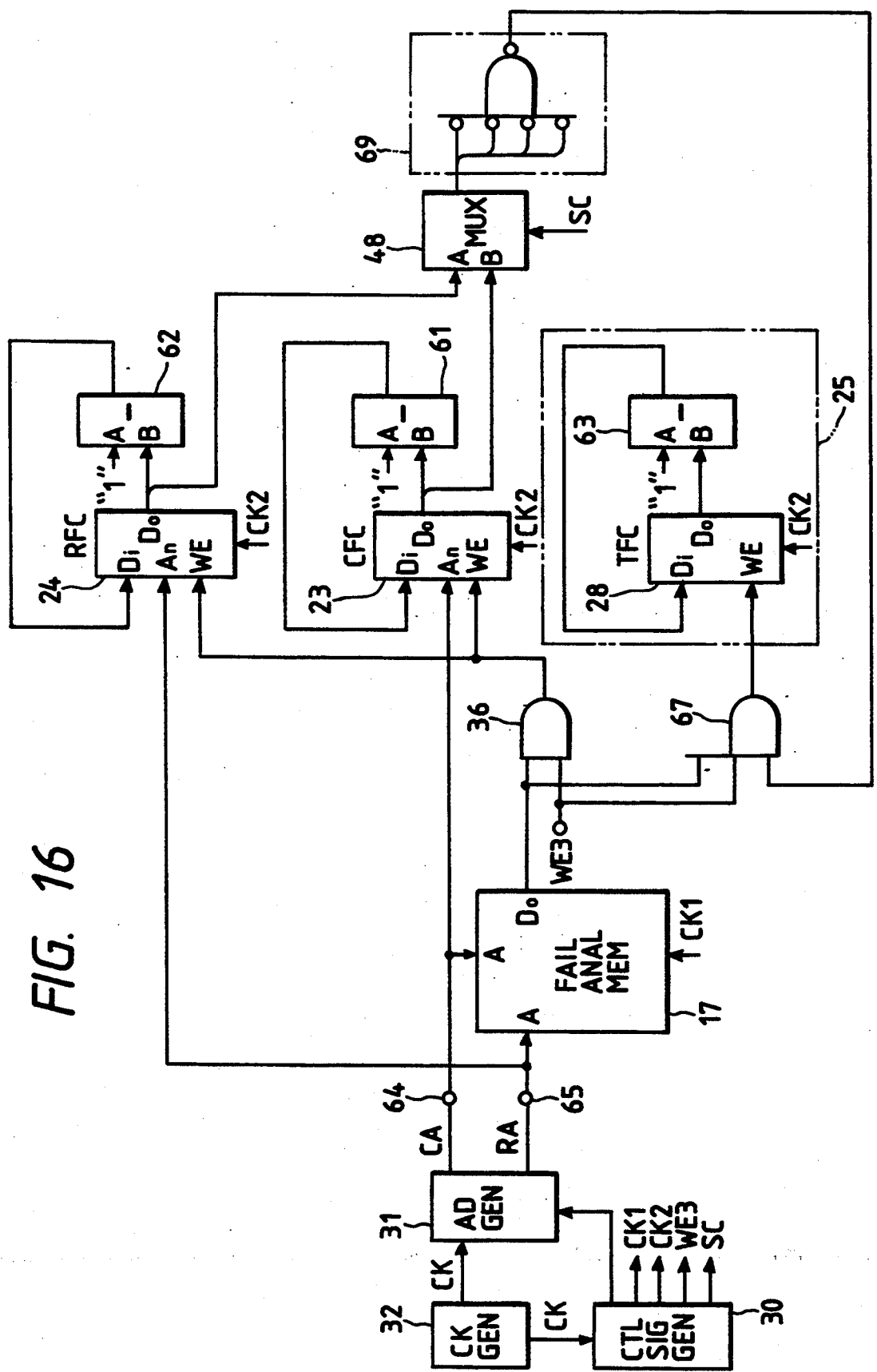
FIG. 16 is a block diagram illustrating an embodiment according to the fourth aspect of the present invention.
Figure 17C:
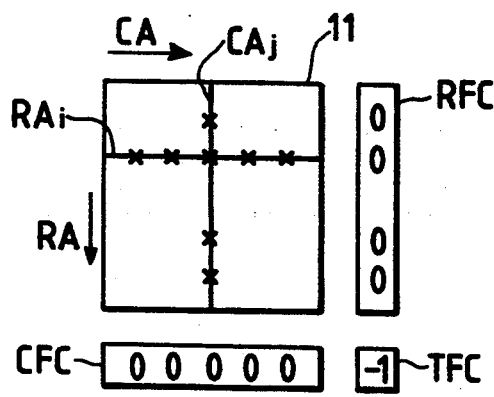
Figure 17D:
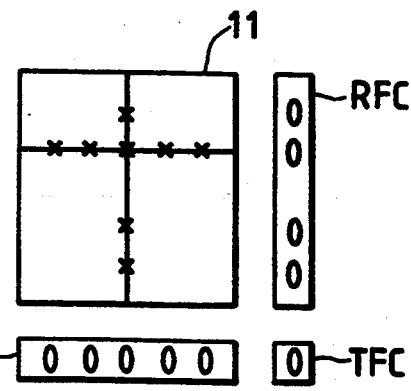

In the embodiment of FIG. 16, the data read out of the CFC memory 23 is subtracted by one in the column subtractor 61 and the result of subtraction is supplied to the data terminal Di of the CFC memory 23 and is written thereinto using the column address as a write address upon application of the write command WE3. On the other hand, in the embodiment of FIG. 7 the data read out of the CFC memory 23 is added by one in the column adder 26 and the result of addition is supplied to the data terminal Di of the CFC memory 23 and is written thereinto using the column address as a write address upon application of the write command. It is therefore possible that an adder-subtractor capable of either of additive and subtractive operations is used both as the column subtractor 61 and the column adder 26; so that the column adder-subtractor is activated for the +1 operation in the case of obtaining the CFC data and is activated for the −1 operation in the case of the CFC data updating based on the saving of failing address lines. Similarly, the adders 27 and 29 in FIG. 7 and the subtractors 62 and 63 in FIG. 16 can be formed by adder-subtractors, respectively.

It is also possible to employ an arrangement in which column adder 26 and the row adder 27 in FIGS. 5 and 7 each have, for example, such a four-bit full adder as explained with the adders 58 in FIG. 14 and perform the +1 operation upon each readout of "1" (i.e. fail) from the failure analysis memory 17 until the number of fails reaches F (=15), but when the number of fails exceeds F (=15), the adders 26 and 27 do not perform the +1 operation but instead provide an output F (=15). That is, when the value of the CFC or RFC data thus obtained falls in between 0 and E (=14), inclusive, the value represents the actual number of fails (the number of defective cells), and when the value of the CFC or RFC data is F (=15), the value represents that the fail number F is equal to or greater than F. Such an arrangement afford not only reduction of the amount of hardware for the column adder 26 and the row adder 27 but also marked reduction of the amount of hardware for the CFC and RFC memories 23 and 24. The reason for which the number of defective cells can be prevented from being counted in excess of a predetermined value as mentioned above is that the actual fail counts CFC and RFC of memories under test rarely exceed 15 and only several spare lines are allotted to each analysis block (for example, two to four for both of the row and column in many cases); therefore, if a fail count CFC or RFC of a memory under test exceeds 15, it is highly possible that the memory under test cannot be saved.

Figure 18:
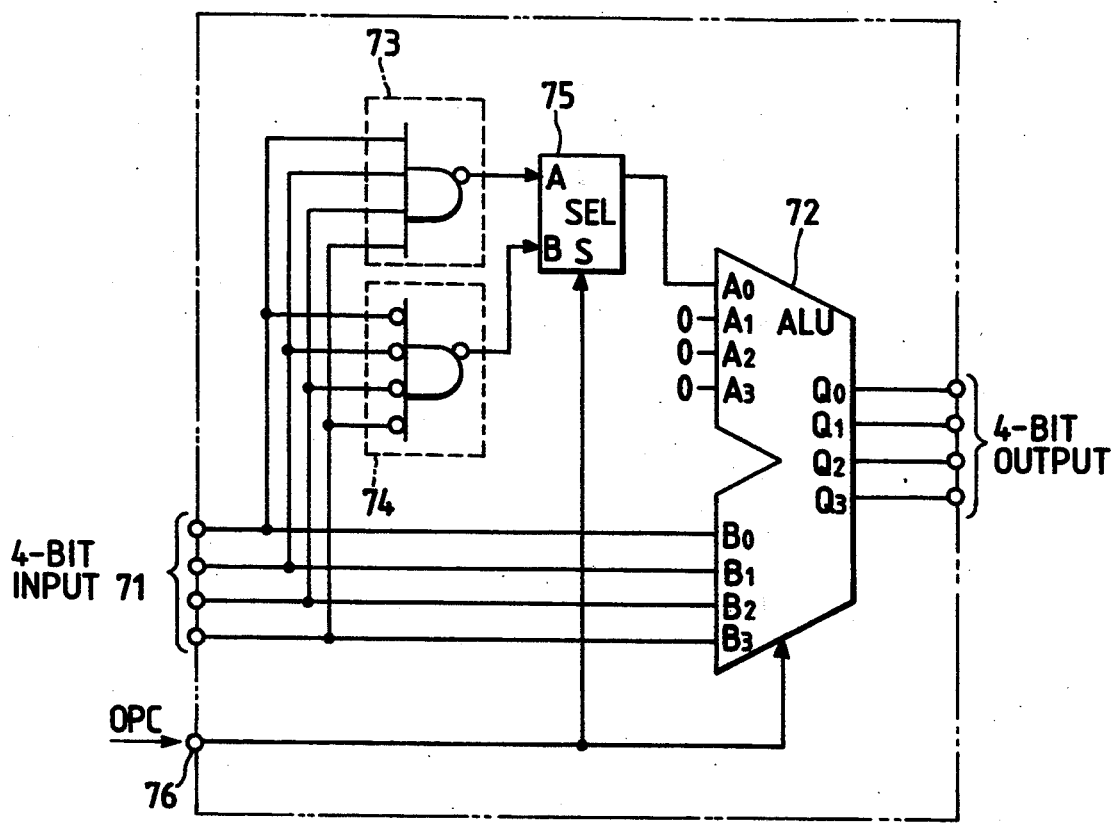
FIG. 18 is a block diagram illustrating an example of an adder-subtractor which serves both as a +1 adder and as −1-subtractor.

FIG. 18 illustrates an example of the adder-subtractor which does not count the number of defective cells in excess of F (=15) and serves both as the adder and as the subtractor. Four-bit data read out of the CFC or RFC memory 23 or 24 is supplied via a terminal 71 to a B input of an ALU (arithmetic logic unit) 72 and to an all-one detector 73 and an all-zero detector 74. The all-one detector 73 outputs a "0" only when the four bits input thereinto are all "1s", and otherwise outputs a "1". The all-zero detector 74 outputs a "0" only when the four bits are all "0s", and otherwise outputs a "1". Either one of the outputs from the all-one detector 73 and the all-zero detector 74 is selected by a selector 75, whose output is applied to the least significant bit $A_0$ of an A input of the ALU 72. The other three bits $A_1$, $A_2$ and $A_3$ of the A input are all supplied with "0s". An operation control signal OPC for specifying whether the operation is an addition or subtraction is applied via a terminal 76 to the ALU 72 and the selector 75.

When the operation control signal OPC indicates the addition, the ALU 72 adds the A and B inputs and the selector 75 selects the output of the all-one detector 73. Consequently, if the input data from the terminal 71 is in the range of between 0 and E (=14), inclusive, the output of the all-one detector 73 is a "1", and since this is applied to the input $A_0$, the ALU 72 outputs data obtained by adding one to the input data supplied from the terminal 71. In the case where the input data from the terminal 71 is F (=15) and its four bits are all "1s", however, the output of the all-one detector 73 goes to a "0" and since this is supplied to the $A_0$ input, the ALU 72 outputs the input data intact while holding its four bits all "1s". When the operation control signal OPC indicates the subtraction, the ALU 72 subtracts the A input from the B input and the selector 75 selects the output of the all-zero detector 74. Consequently, if the input data from the terminal 71 is in the range of between 1 and F (=15), inclusive, then the all-zero detector 74 outputs a "1" and since this output is applied to the input $A_0$, the ALU 72 outputs data obtained by subtracting one from the input data supplied from the terminal 71. In the case where the input data from the terminal 71 is 0 and its four bits are all "0s", however, the output of the all-zero detector 74 goes to a "0", and this output is supplied to the input $A_0$; so that the ALU 72 outputs the input data intact while holding its four bits all "0s" that is subtraction into negative region is prevented.

Figure 19:
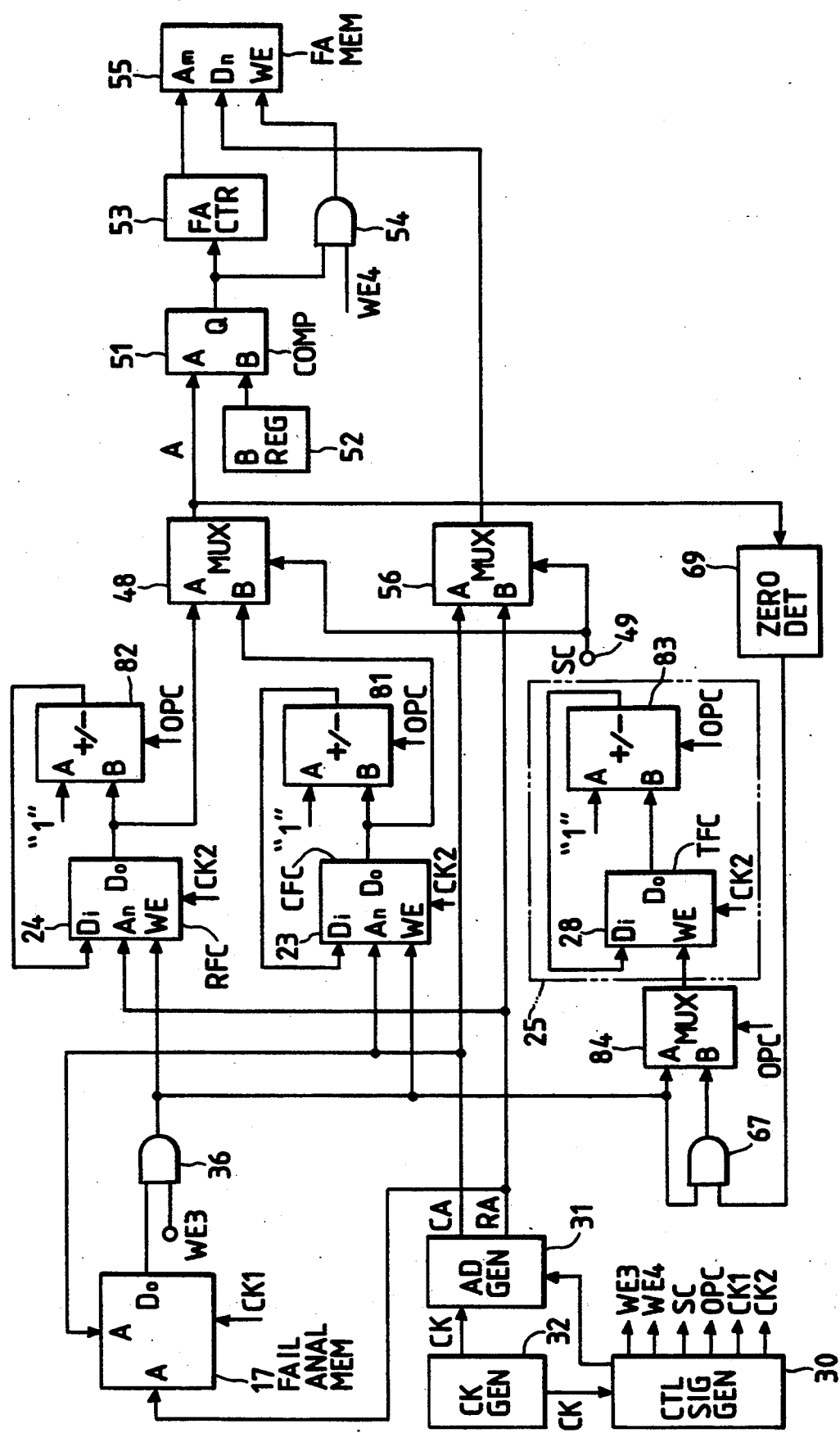
FIG. 19 is a block diagram illustrating an example of the device which is a combination of the embodiments depicted in FIGS. 7, 12 and 16.

FIG. 19 illustrates, by way of example, an analyzing device for failure saving use which comprises, in combination, the FIG. 7 embodiment for counting the data CFC, RFC and TFC, the FIG. 12 embodiment for detecting failing address lines and the FIG. 16 embodiment for updating the data CFC, RFC and TFC as a result of the saving of failing address lines. In this example, however, the address counters 33 and 35 and the carry selector in FIG. 7 are not used but instead the column and row addresses are all produced by the address generator 31. The CFC, RFC and TFC memories 23, 24 and 28 in FIGS. 7, 12 and 16 are used in common and the adders 26, 27 and 29 in FIGS. 7 and 12 and the subtractors 61, 62 and 63 in FIG. 16 are respectively formed as adder-subtractors 81, 82 and 83 of such a construction as shown in FIG. 18. The multiplexers 48 in the embodiments of FIGS. 12 and 16 are substituted with a common multiplexer. A multiplexer 84 is provided for switching the write enable condition for the TFC memory 28 between the CFC, RFC and TFC counting operations in the embodiment of FIG. 7 and the CFC, RFC and TFC updating operations in the embodiment of FIG. 16. That is, the multiplexer 84 is controlled by the operation control signal OPC to supply the write command WE3 having passed through the gate 36 to the write enable terminal WE of the TFC memory 28 in the CFC, RFC and TFC counting operations and the write command WE3 having passed through the gate 67 to the TFC memory 28 in the updating operation. In the failing address line detection the write command WE3 is not generated, and consequently, no writes are effected in the memories 23, 24 and 28 but only their readout is performed in response to the clock CK2. Therefore, the detection of failing addresses is not affected by the operation control signal OPC, whether it is a "0" or "1". The control signal generator 30 is supplied with the clock CK, generates the write commands WE3 and WE4, the select control signal SC and the operation control signal OPC for controlling the operation of the entire device in accordance with a program, sets the number of spare lines in the register 52, and control the address generation by the address generator 31. In the case of forming this analyzer as a part of the memory test equipment depicted in FIG. 3, it is possible to employ the control signal generator 30 which constitutes the pattern generator 14, together with the clock generator 32 and the address generator 31.

As described above, according to the first aspect of the present invention, the data CFC, RFC and TFC for failure saving use are counted in the course of a function test of a memory, and the counting of each data is completed at the same time as the function test comes to an end—this eliminates the necessity of the conventional processing for obtaining the CFC, RFC and TFC data by reading out the failure analysis memory after the function test, and hence reduces the time for the failure saving analysis accordingly.

According to the second aspect of the present invention, the data CFC, RFC and TFC are all obtained by a single readout of the entire area of one analysis block of the failure analysis memory; so that the processing time is shorter than in the prior art which requires reading-out of the entire area of the analysis memory once for each of the data CFC and RFC. In addition, the data CFC, RFC and TFC are obtained by hardware and the failure analysis memory needs only to be read out simply and continuously—this also simplifies the processing and reduces the processing time.

According to the third aspect of the present invention, the detection of failing address lines is performed by hardware, and hence can be done in a short time.

According to the fourth aspect of the present invention, the updating of the data CFC, RFC and TFC, based on the saving of failing address lines, is performed by hardware, and hence permits a continuous readout of respective cells on the saved address lines, thus reducing the processing time therefor.

It will be apparent that many modifications and variations may be effected without departing from the scope of the novel concepts of the present invention.

What is claimed is:

1. An analyzing device for saving memory failures, comprising:
   address generating means for sequentially generating column and row addresses in pairs;
   a failure analysis memory, sequentially supplied with the result of a logical comparison for each memory cell of a memory under test, for storing a data "1" at an address thereof specified by one of said column and row address pairs when said result of comparison is a signal representing a disagreement between data supplied to said memory under test and data read out therefrom, said failure analysis memory performing a read modify write operation, said memory under test having spare lines which are used as substitutes for address lines which are determined to be failing;
   an inhibit gate, supplied with said data "1" read out of said failure analysis memory, as an inhibit signal, and said result of the comparison for inhibiting said result of comparison from passing therethrough when a "1" is read out of said failure analysis memory and supplied thereto during said read modify write operation of said failure analysis memory, thereby inhibiting from passing therethrough a second and subsequent disagreement signals detected from the same memory cell of said memory under test;
   a column address fail count memory, supplied, as an address, with the same column address as supplied to said failure analysis memory simultaneously therewith, for performing a read modify write operation each time said disagreement signal is applied thereto as an enable signal from said inhibit gate;
   first arithmetic means for adding a "1" to data read out of said column address fail count memory during said read-modify-write operation thereof and providing the result of said addition to said column address fail count memory to be written thereinto as a count value during said read modify write operation, whereby a count value stored at each address of said column address fail count memory is updated in accordance with the number of defective cells on the corresponding column address line of said memory under test;
   a row address fail count memory, supplied, as an address, with the same row address as supplied to said failure analysis memory simultaneously therewith, for performing a read modify write operation each time said disagreement signal is applied thereto as an enable signal from said inhibit gate;
   second arithmetic means for adding a "1" to data read out of said row address fail count memory during said read-modify-write operation thereof and providing the result of said addition to said row address fail count memory to be written thereinto as a count value during said read modify write operation, whereby a count value stored at each address of said row address fail count memory is updated in accordance with the number of defective cells on the corresponding row address line of said memory under test;
   fail counting means for counting the number of said enable signals outputted from said inhibit gate; and
   control means for controlling operations of said failure analysis memory, said column address fail count memory, said row address fail count memory and said fail counting means as well as operating said failure analysis memory, said column address fail count memory, said row address fail count memory and said fail counting means simultaneously during a read modify write mode for completing the counting operation of defective cells concurrently with the end of the test for said memory under test.

2. The device according to claim 1, further comprising:
   spare line number register means for storing the numbers of usable row and column spare lines of said memory under test;
   comparator means for comparing the number of defective cells sequentially read out of said column address fail count memory by application of said column address thereto from said address generating means with said number of row spare lines stored in said spare line number register means and outputting, when the former is greater than the latter, a column fail signal indicating that the column address line of said memory under test corresponding to said column address is defective, and for comparing the number of defective cells sequentially read out of said row address fail count memory by application of said row address thereto from said address generating means with said number of column spare lines stored in said spare line number register means and outputting, when the former is greater than the latter, a row fail signal indicating that the row address line of said memory under test corresponding to said row address is defective;

failing address line counter means which counts said column fail signal outputted from said comparator means and counts said row fail signal outputted from said comparator means; and failing address memory means which is supplied, as an address, with the column fail signal count value of said failing address line counter means, for storing, each time said column fail signal is outputted from said comparator means, the column address at that time written as data, and which is supplied, as an address, with the row fail signal count value of said failing address line counter means, for storing, each time said row fail signal is outputted from said comparator means, the row address at that time as data.

3. The device according to claim 2, wherein said comparator means includes a first multiplexer for selecting either one of the number of defective cells read out of said column address fail count memory and the number of defective cells read out of said row address fail count memory for comparison with either one of the number of row or the number of column spare lines, and wherein said failing address memory means includes a second multiplexer for selecting either one of said column address or said row address in correspondence to the selection by said first multiplexer, whereby either one of said column address and said row address is written into said failing address memory means as data.

4. The device according to claim 1, wherein said fail counting means includes a total fail count memory which performs a read modify write operation each time said enable signal is applied thereto from said inhibit gate, and third arithmetic means for adding a "1" to data read out from said total fail count memory during said read modify write operation thereof and providing the result of said addition to said total fail count memory to be written thereinto during said read modify write operation.

5. The device according to claim 4, wherein said first, second and third arithmetic means are each an adder-subtractor which can be controlled to add a "1" to or subtract a "1" from input data in response to an operation control signal from said control means, and wherein said control means controls said address generating means and said failure analysis memory to read out said failure analysis memory by sequentially changing the row or column address thereof for a desired column or row address of said failure analysis memory and also controls said first, second and third arithmetic means to perform a subtractive operation, whereby, each time a "1" representing a defective cell on said desired column or row address of said failure analysis memory is read out therefrom, a "1" is subtracted from the numbers of column and row defective cells at the corresponding addresses of said column and row address fail count memories to update said input data.

6. The device according to claim 5, further comprising:

a multiplexer for selectively outputting either one of said number of column defective cells read out of said column address fail count memory and said number of row defective cells read out of said row address fail count memory; and rewrite inhibit means for detecting whether said number of column or row defective cells selectively outputted from said multiplexer is a "0", and inhibiting, upon detection of a "0", said enable signal from being applied to said total fail count memory thereby inhibiting a rewrite of the contents of said total fail count memory.

7. The device according to claim 5, wherein each of said adder-subtractors includes:

an arithmetic logic unit provided with a first set of input terminals, the number of which is equal to that of bits of an input data thereto, a second set of input terminals, the number of which is equal to that of said first input terminals, and a set of output terminals, the number of which is equal to that of said first input terminals, said second set of input terminals being always supplied with "0s" except one input terminal thereof into which the least significant bit of an input data is inputted, said arithmetic and logic unit being capable of selectively performing an addition or subtraction of data inputted into said second input terminals to or from data inputted into said first input terminals;

all-zero detector means for outputting a "0" when detecting that all bits of said input data to said first input terminals are "0s", and outputting a "1" in other cases;

all-one detector means for outputting a "0" when detecting that all bits of said input data to said first input terminals are "1s", and outputs a "1" in other cases; and selector means for selecting the output of said all-one detector means or all-zero detector means, depending on whether said arithmetic and logic unit is set for addition or subtraction, and applying said selected output to said least significant bit terminal of said second input terminals of said arithmetic and logic unit.

8. An analyzing device for saving memory failures, comprising:

address generating means for sequentially generating column and row addresses in pairs;

a failure analysis memory supplied with the result of a logical comparison for each memory cell of a memory under test specified by each of said column and row address pairs supplied thereto, for storing data "1" at an address thereof specified by one of said column and row address pairs when said result of the comparison is a signal representing a disagreement between data supplied to said memory under test and data read out therefrom, said memory under test having spare lines which are used as substitutes for address lines which are determined to be failing;

memory read out means for sequentially reading out the results of the logical comparison stored in said failure analysis memory by applying said column and row address pairs from said address generating means to said failure analysis memory after said failure analysis memory has stored all the results of the logical comparison;

a column address fail count memory, supplied, as an address, with the same column address as supplied to said failure analysis memory for read out thereof simultaneously therewith, for performing a read modify write operation each time a "1" read out of said failure analysis memory is applied thereto as an enable signal;

first arithmetic means for adding a "1" to data read out of said column address fail count memory during said read-modify-write operation thereof and providing the result of said addition to said column address fail count memory to be written thereinto as a count value during said read modify write operation, whereby a count value stored at each address of said column address fail count memory is updated in accordance with the number of defective cells on the corresponding column address line of said memory under test;

a row address fail count memory, supplied, as an address, with the same row address as supplied to said failure analysis memory for read out thereof simultaneously therewith, for performing a read modify write operation each time a "1" read out of said failure analysis memory is applied thereto as an enable signal;

second arithmetic means for adding a "1" to data read out from said row address fail count memory during said read-modify-write operation thereof and providing the result of said addition to said row address fail count memory to be written thereinto as a count value during said read modify write operation, whereby a count value stored at each address of said row address fail count memory is updated in accordance with the number of defective cells on the corresponding row address line of said memory under test;

fail counting means for counting the number of said enable signals read out from said failure analysis memory; and control means for controlling operations of said failure analysis memory, said column address fail count memory, said row address fail count memory and said fail counting means as well as operating said column address fail count memory, said row address fail count memory and said fail counting means simultaneously in a read modify write mode so that the number of defective cells on the row address lines and the total number of defective cells can be counted at the same time by only one scanning of said failure analysis memory.

9. The device according to claim 8, further comprising:

spare line number register means for storing the numbers of usable row and column spare lines of said memory under test;

comparator means for comparing the number of defective cells sequentially read out of said column address fail count memory by application of said column address thereto from said address generating means with said number of row spare lines stored in said spare line number register means and outputting, when the former is greater than the latter, a column fail signal indicating that the column address line of said memory under test corresponding to said column address is defective, and for comparing the number of defective cells sequentially read out of said row address fail count memory by application of said row address thereto from said address generating means with said number of column spare lines stored in said spare line number register means and outputting, when the former is greater than the latter, a row fail signal indicating that the row address line of said memory under test corresponding to said row address is defective;

failing address line counter means which counts said column fail signal outputted from said comparator means and counts said row fail signal outputted from said comparator means; and failing address memory means which is supplied, as an address, with the column fail signal count value of said failing address line counter means, for storing, each time said column fail signal is outputted from said comparator means, the column address at that time as data, and which is supplied, as an address, with the row fail signal count value of said failing address line counter means, for storing, each time said row fail signal is outputted from said comparator means, the row address at that time as data.

10. The device according to claim 9, wherein said comparator means includes a first multiplexer for selecting either one of the number of defective cells read out from said column address fail count memory and the number of defective cells read out from said row address fail count memory for comparison with either one of the number of row or the number of column spare lines, and wherein said failing address memory means includes a second multiplexer for selecting either one of said column address and said row address in correspondence to the selection by said first multiplexer whereby either one of said column address or said row address is written into said failing address memory means as data.

11. The device according to claim 8, wherein said fail counting means includes a total fail count memory which performs a read modify write operation each time a "1" read out of said failure analysis memory is applied thereto as an enable signal, and third arithmetic means for adding a "1" to data read out from said total fail count memory during said read modify write operation thereof and providing the result of said addition to said total fail count memory to be written thereinto by said read modify write operation.

12. The device according to claim 11, wherein said first, second and third arithmetic means are each an adder-subtractor which can be controlled to add a "1" to or subtract a "1" from input data in response to an operation control signal from said control means, and wherein said control means controls said address generating means and said failure analysis memory to read out said failure analysis memory by sequentially changing the row or column address thereof for a desired column or row address of said failure analysis memory and also controls said first, second and third arithmetic means to perform a subtractive operation, whereby, each time a "1" representing a defective cell on said desired column or row address of said failure analysis memory is read out therefrom, a "1" is subtracted from the respective numbers of column and row defective cells at the corresponding addresses of said column and row address fail count memories to update said input data.

13. The device according to claim 12, further including a multiplexer for selectively outputting either one of said number of column defective cells read out from said column address fail count memory and said number of row defective cells read out from said row address fail count memory, and rewrite inhibit means for detecting whether said number of column or row defective cells selectively outputted from said multiplexer is a "0" or not and inhibiting, upon detection of "0", said enable signal from being applied to said total fail count memory thereby inhibiting a rewrite of the contents of said total fail count memory.

14. The device according to claim 12, wherein each of said adder-subtractor includes:

an arithmetic and logic unit provided with a first set of input terminals the number of which is equal to the number of bits of an input data thereto, a second set of input terminals the number of which is equal to the number of said first input terminals, and a set of output terminals the number of which is equal to the number of said first input terminals, said second set of input terminals being always supplied with "0s" except one input terminal thereof into which a least significant bit is inputted, said arithmetic and logic unit being capable of selectively performing an addition or subtraction of a data inputted into said second input terminals to or from a data inputted into said first input terminal;

all-zero detector means which outputs a "0" when it detects that all bits of said input data to said first input terminals are "0", and outputs a "1" in other cases;

all-one detector means which outputs a "0" when it detects that all bits of said input data to said first input terminals are "1", and outputs a "1" in other cases; and selector means which selects the output of one of said all-one detector means or said all-zero detector means, depending on whether said arithmetic and logic unit is set for addition or subtraction, and applies said selected output to said least significant bit terminal of said second input terminals of said arithmetic and logic unit.

* * * * *

UNITED STATES PATENT AND TRADEMARK OFFICE
CERTIFICATE OF CORRECTION

PATENT NO. : 5,410,687
DATED : April 25, 1995
INVENTOR(S) : Fujisaki et al

It is certified that error appears in the above-indentified patent and that said Letters Patent is hereby corrected as shown below:

Col. 2, line 22, change "$J.M + I.N-M.N.$" to $J{\bullet}M + 1{\bullet}N-M{\bullet}N$-- line 28, change "$=$" to --$\equiv$-- line 30, change "$=$" to --$\equiv$--

Col. 6, line 30, change "17a" to --17A-- line 35, after "as" insert --a--

Col. 8, line 5, after "28" insert --to be incremented--

Col. 9, line 41, after "1" insert --,-- line 44, after "1" insert --,--

Col. 16, line 13, after "58" insert --.-- line 13, after "1" insert --,--

Col. 20, line 28, after "1" insert --,--

UNITED STATES PATENT AND TRADEMARK OFFICE
CERTIFICATE OF CORRECTION

PATENT NO.   : 5,410,687
DATED        : April 25, 1995
INVENTOR(S) : Kenichi Fujisaki, et al.

It is certified that error appears in the above-indentified patent and that said Letters Patent is hereby corrected as shown below:

Column 20, line 36, after "0s" insert --,--.

Signed and Sealed this

Tenth Day of October, 1995

Attest:

BRUCE LEHMAN

Attesting Officer

Commissioner of Patents and Trademarks